(12) United States Patent
Yamauchi et al.

(10) Patent No.: US 6,503,778 B1
(45) Date of Patent: Jan. 7, 2003

(54) THIN FILM DEVICE AND METHOD OF MANUFACTURING THE SAME

(75) Inventors: Kazushi Yamauchi, Kanagawa (JP); Takeshi Matsushita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/670,275

(22) Filed: Sep. 27, 2000

(30) Foreign Application Priority Data

Sep. 28, 1999 (JP) .......................................... 11-274062

(51) Int. Cl.⁷ .............................................. H01L 21/44
(52) U.S. Cl. ...................................... 438/107; 438/406
(58) Field of Search .................................. 438/107, 406

(56) References Cited

U.S. PATENT DOCUMENTS

| | | | | |
|---|---|---|---|---|
| 5,489,554 A | * | 2/1996 | Gates ........................... | 438/107 |
| 6,025,648 A | * | 2/2000 | Takahashi et al. ........... | 257/778 |
| 6,027,999 A | * | 2/2000 | Wong .......................... | 438/637 |
| 6,083,773 A | * | 7/2000 | Lake ............................ | 438/108 |
| 6,268,238 B1 | * | 7/2001 | Davidson et al. ........... | 438/107 |
| 6,287,892 B1 | * | 9/2001 | Takahashi et al. .......... | 438/107 |
| 6,287,893 B1 | * | 9/2001 | Elenius et al. ............. | 438/108 |
| 6,287,940 B1 | * | 9/2001 | Cole et al. ................. | 438/455 |
| 2001/0031548 A1 | * | 10/2001 | Elenius et al. ............. | 438/613 |

FOREIGN PATENT DOCUMENTS

EP 0 288 186 * 8/1988 ........... H01L/25/06

* cited by examiner

Primary Examiner—Chandra Chaudhari
Assistant Examiner—David S Blum
(74) Attorney, Agent, or Firm—Sonnenschein, Nath & Rosenthal

(57) ABSTRACT

A first device unit is formed by adhering a backside support substrate to a backside of a first device layer. A second device unit is formed by adhering a surface support substrate to a surface of a second device layer. A thin film device comprising the first and the second device layers is manufactured by adhering the first and the second device units to face the first device layer and the second device layer each other. The first and the second device layers are individually formed in the manufacturing process of the first and the second device units. This has no limitation in a method of forming the device layer unlike the case where forming a plurality of device layers by stacking in order.

2 Claims, 24 Drawing Sheets

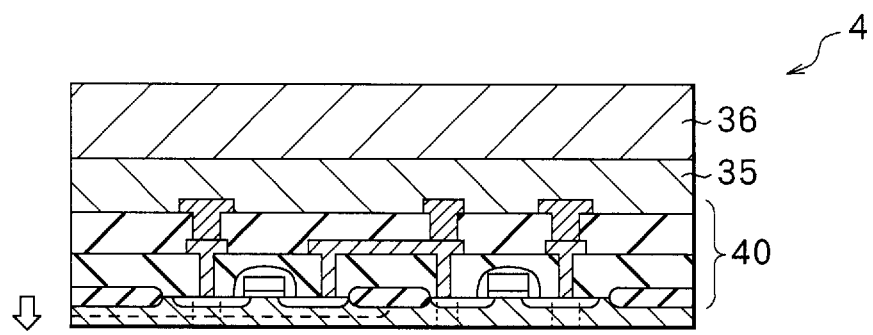
FIG.9A
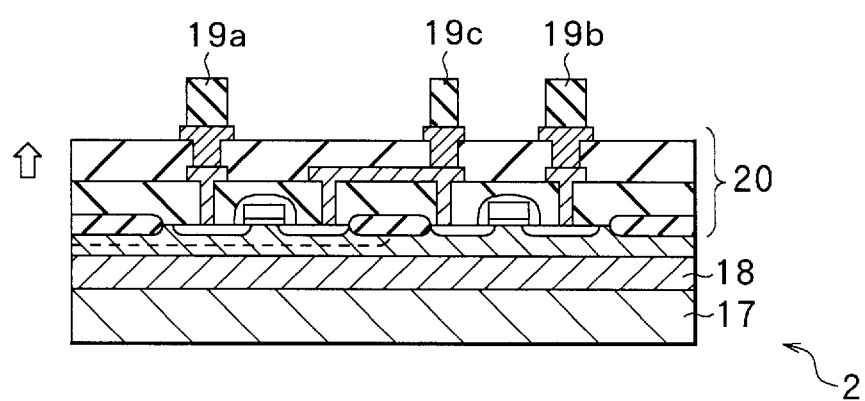
FIG.9B
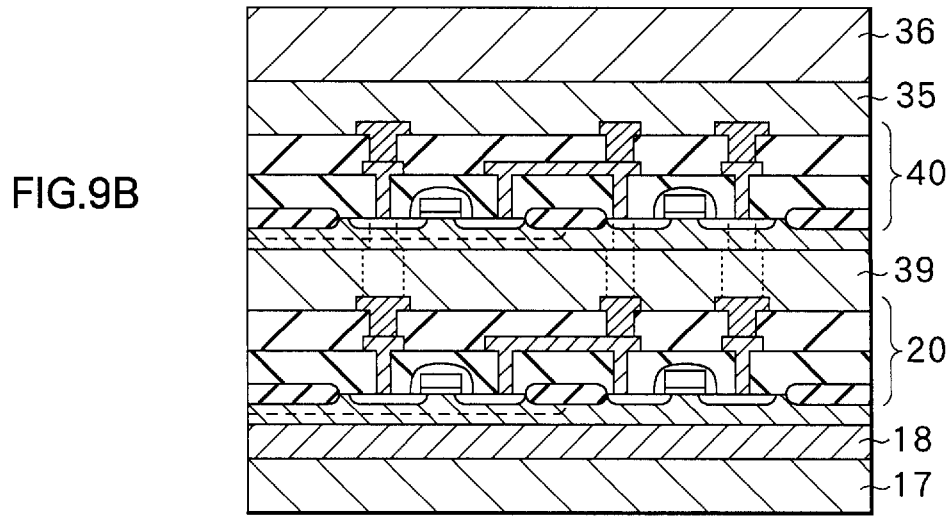

THIN FILM DEVICE AND METHOD OF MANUFACTURING THE SAME

BACKGROUND OF THE INVENTION

1. Field of the Invention

The present invention relates to a method of manufacturing a thin film device comprising a plurality of device layers.

2. Description of the Related Art

Stacked thin film devices comprising a plurality of device layers have been known. Such a thin film device is manufactured by stacking a plurality of device layers in order on a substrate. In the manufacturing process, the device layers are stacked by a low temperature process such as plasma CVD (Chemical Vapor Deposition). If a high temperature process such as thermal CVD is applied to stack the device layers, the already formed device layers may be damaged because of thermal diffusion or the like.

However, it is difficult for plasma CVD or the like to fast deposit like thermal CVD. This requires time to form each device layer and therefore prevents throughput in the manufacturing process of a thin film device from increasing.

SUMMARY OF THE INVENTION

The present invention is made in view of such problems. An object of the invention is to provide a thin film device capable of improving throughput in the manufacturing process and a method of manufacturing the same.

A method of manufacturing a thin film device according to the present invention includes the steps of: forming a plurality of device units in which a support substrate supports a device layer; and forming a thin film device by combining the plurality of device units.

Another method of manufacturing a thin film device according to the present invention includes the steps of forming a plurality of device units in which a support substrate supports a device layer; and adhering two device units out of the plurality of device units to face each device layer.

Still another method of manufacturing a thin film device according to the present invention includes the steps of: forming an inside insulating layer made of an insulating material in a semiconductor layer having a pair of facing surface; forming a first device layer on a side of the semiconductor layer; and forming a second device layer on the other side of the semiconductor layer.

A thin film device of the present invention comprises integrally formed a light emitting device layer emitting light and a photodetector layer receiving light.

According to a method of manufacturing a thin film device and another method of manufacturing a thin film device of the invention, a plurality of device units in which a support substrate supports the device layer is manufactured in advance and a thin film device is manufactured by combining the device units. The device layer is formed by each device unit simultaneously. This enables to reduce time for forming the device layer. In addition, fast deposition by thermal CVD, which is impossible to use in a conventional method that stacking the device layer in order, can be used. This allows further reduction of time for forming the device layer. As the device layer is supported by the support substrate, a thin device layer of, for example, 1 $\mu$m in thickness can be combined.

According to still another method of manufacturing a thin film device of the invention, the device layers are formed on both surfaces of the semiconductor layer, respectively. As a result, the thin film device comprising a plurality of device layers is obtained. The individual formation of the device layers on each surface of the semiconductor layer has no limitation in a method of forming the device layer unlike forming a plurality of device layers by stacking in order. Accordingly, a method of forming a device layer in short time such as fast epitaxial growth can be chosen. The inside insulating layer provided in the semiconductor layer electrically separate two device layers.

According to a thin film device of the invention, a second device layer can detected light emitting from a first device layer when the light is reflected by an object and returned.

Other and further objects, features and advantages of the invention will appear more fully from the following description.

BRIEF DESCRIPTION OF THE DRAWINGS

FIGS. 9A and 9B are sectional views for illustrating adhering process of a first device unit and a second device unit according to the first embodiment of the invention;

DETAILED DESCRIPTION OF THE PREFERRED EMBODIMENTS

Embodiments of the present invention will now be described below in detail with reference to the accompanying drawings.

[First Embodiment]

Reference is made to FIG. 1 to FIG. 12, describing a thin film device and a method of manufacturing the same according to a first embodiment of the invention.

<Configuration of Thin Film Device>

Figure 1:
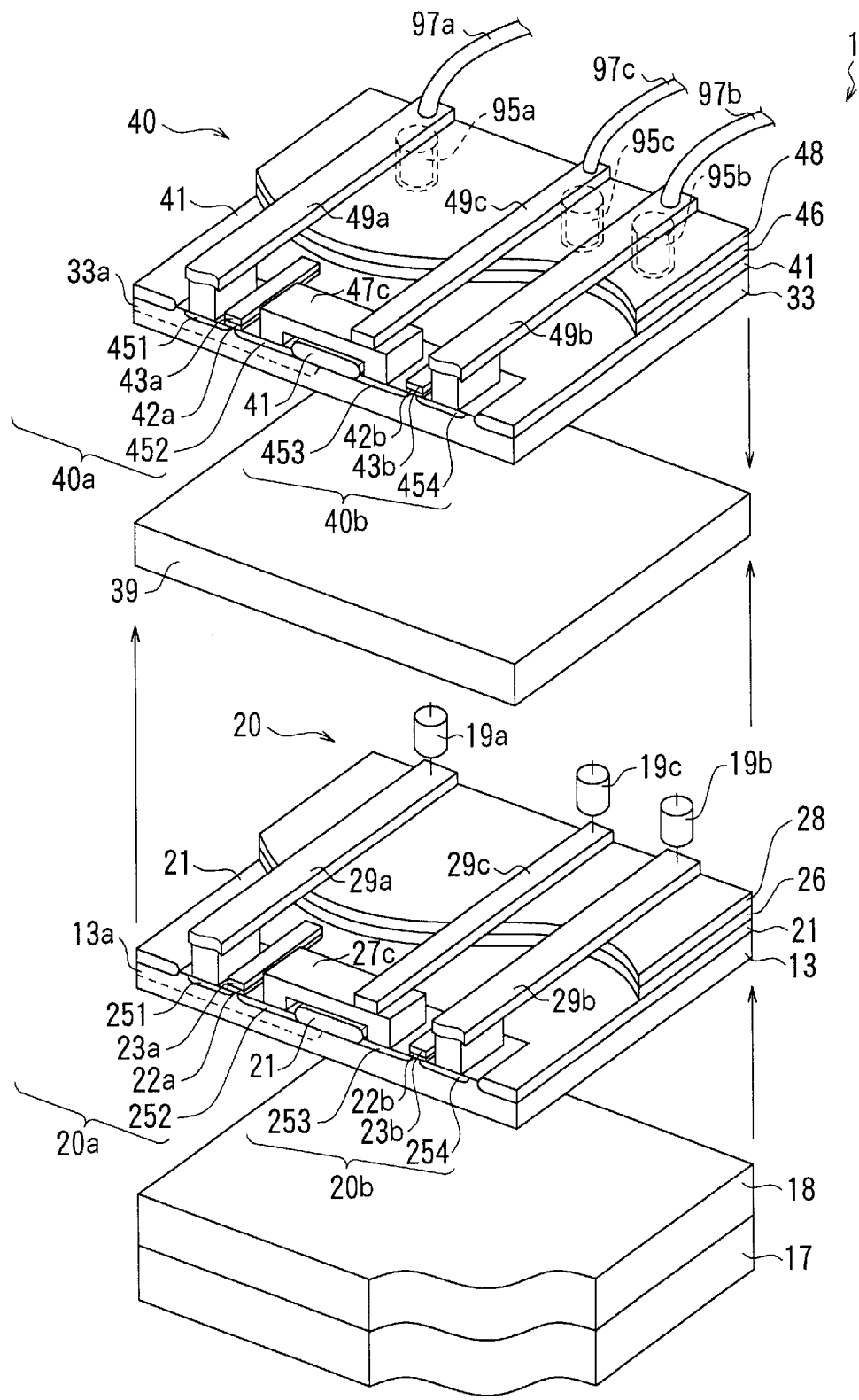
FIG. 1 is a view for illustrating a structure of a thin film device according to a first embodiment of the invention.

FIG. 1 shows a basic configuration of a thin film device 1 according to the embodiment. The thin film device 1 comprises a plurality of device layers, for example, two device layers. Each device layer constitutes a circuit element such as transistor, capacitor, laser diode and photo diode or an integrated circuit such as CPU (Central Processing Unit) and DRAM (Dynamic Random Access Memory). In this embodiment, the thin film device 1 comprises two device layers that constitute CMOS (Complementaly Metal-oxide Semiconductor) transistor.

The thin film device 1 comprises a first device layer 20 and a second device layer 40. The first device layer 20 is formed on a surface of a semiconductor layer 13 made of, for example, p-type single crystal silicons On the semiconductor layer 13, an isolate insulating film 21 for isolating adjacent devices is formed in a predetermined pattern. On a surface of the semiconductor layer 13 uncovered with the isolate insulating film 21, a p channel-type transistor 20a and an n channel-type transistor 20b are formed.

An n well 13a, which is an area diffusing n-type impurity having relatively low concentration, is formed on the area of the surface of the semiconductor layer 13 for forming the p channel-type transistor 20a. The p channel-type transistor 20a comprises p-type impurity areas (hereinafter, called a p area) 251 and 252 formed by implanting a p-type impurity on the n well 13a and a gate-cum-word line 23a formed on the p areas 251 and 252 sandwiching a gate insulating film 22a. The n channel-type transistor 20b comprises n-type impurity areas (hereinafter, called an n area) 253 and 254 formed by implanting a n n-type impurity on the surface of the semiconductor layer 13 an d a gate-cum-word line 23b formed on the n areas 253 and 254 sandwiching a gate insulating film 22b. The transistors 20a and 20b are covered with a first interlayer insulating layer 26 and a second interlayer insulating layer 28 made of an insulating material. On the second interlayer insulating layer 28, surface wiring layers 29a, 29b and 29c made of metal are formed.

Figure 4A:
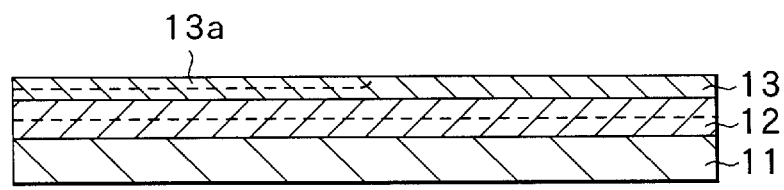
FIGS. 4A through 4D are sectional views for illustrating the step continued from FIGS. 3A through 3D.
Figure 4B:
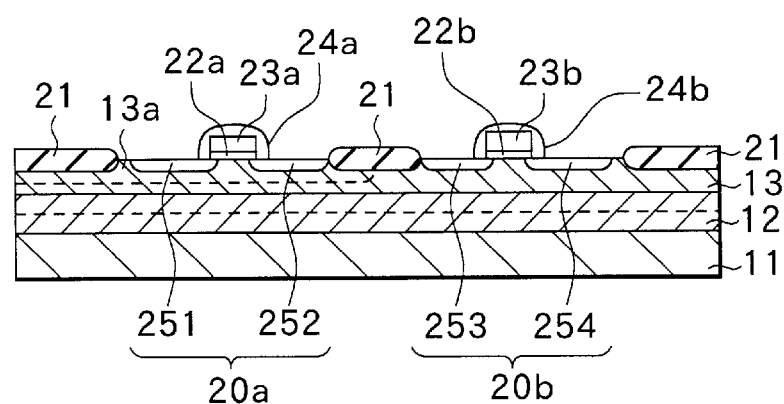
Figure 4C:
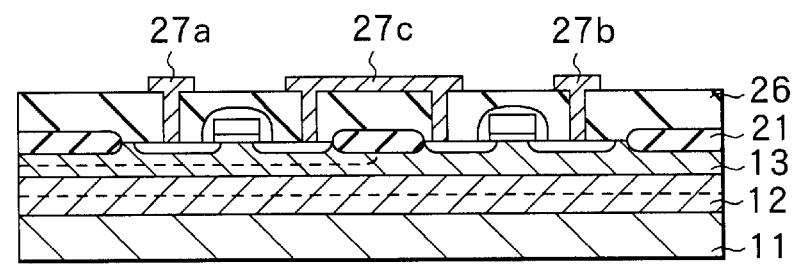

The p area 251 is connected to the surface wiring layer 29a thorough unshown intermediate wiring layer 27a (see FIG. 4C). The n area 254 is connected to the surface wiring layer 29b thorough unshown intermediate wiring layer 27b (see FIG. 4C). The p area 252 and the n area 253 are connected to an intermediate wiring layer 27c which is connected to the surface wiring layer 29c.

The second device layer 40 has the same configuration as the first device layer 20. Specifically, an isolate insulating film 41 is formed on a surface of a semiconductor layer 33 made of, for example, p-type single crystal silicon. On a surface of the semiconductor layer 33 uncovered with the isolate insulating film 41, a p channel-type transistor 40a and an n channel-type transistor 40b are formed.

The p channel-type transistor 40a comprises p areas 451 and 452 formed on an n well 33a of the semiconductor layer 33 and a gate 43a formed on the p areas 451 and 452 sandwiching a gate insulating film 42a. The n channel-type transistor 40b comprises n areas 453 and 454 formed on the surface of the semiconductor layer 33 and a gate 43b formed on the n areas 453 and 454 sandwiching a gate insulating film 42b. The transistors 40a and 40b are covered with a first interlayer insulating layer 46 and a second interlayer insulating layer 48 made of an insulating material. On the second interlayer insulating layer 48, surface wiring layers 49a, 49b and 49c are formed.

Figure 7A:
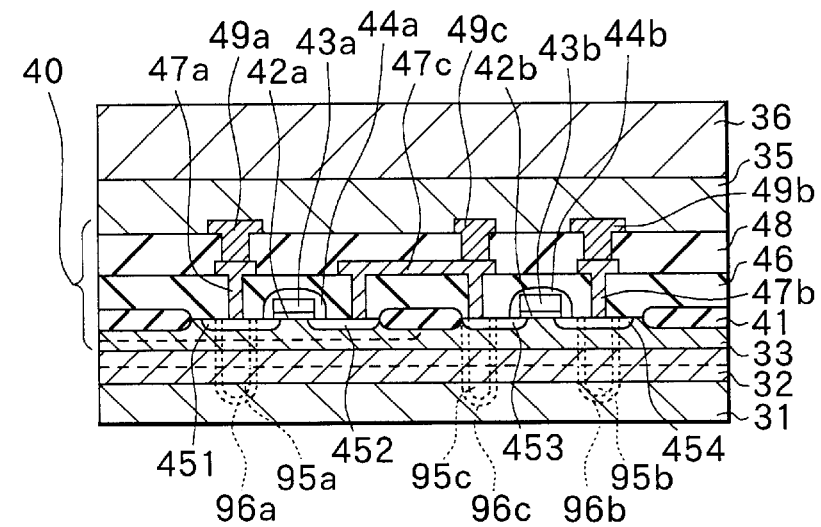
FIGS. 7A through 7D are sectional views for illustrating a method manufacturing a second device unit according to a method of manufacturing a thin film device of the first embodiment of the invention.

The p area 451 is connected to the surface wiring layer 49a thorough unshown intermediate wiring layer 47a (see FIG. 7A). The n area 454 is connected to the surface wiring layer 49b thorough unshown intermediate wiring layer 47b (see FIG. 7A). The p area 452 and the n area 453 are connected to an intermediate wiring layer 47c which is connected to the surface wiring layer 49c. The surface wiring layers 49a, 49b and 49c are respectively connected to power supply potential, earth potential and output potential through lead wires 97a, 97b and 97c.

The first device layer 20 and the second device layer 40 are adhered with an adhesive 39 made of, for example, epoxy resin. A backside support substrate 17 of, for example, plastic film is adhered to the first device layer 20 on the opposite side facing to the second device layer 40 (downside in FIG. 1) sandwiching an adhesive 18 made of, for example, epoxy resin. The first device layer 20 and the second device layer 40 are about 1 μm thick and the backside support substrate 17 is about 1 mm thick, for example. The backside support substrate 17, therefore, supports whole thin film device 1. In FIG. 1, the first device layer 20 and the second device layer 40 are illustrated thicker than the backside support substrate 17.

The surface wiring layers 29a, 29b and 29c of the first device layer 20 are respectively connected to the surface wiring layers 49a, 49b and 49c through solder bumps 19a, 19b and 19c. The surface wiring layers 49a, 49b and 49c of the second device layer 40 are respectively connected to the solder bumps 19a, 19b and 19c through plugs 95a, 95b and 95c provided to penetrate the semiconductor layer 33, the isolate insulating film 41, the first interlayer insulating layer 46 and the second interlayer insulating layer 48.

As a result, the surface wiring layers 29a, 29b and 29c of the first device layer 20 are connected to power supply potential, output potential and earth potential, respectively through the solder bumps 19a, 19b and 19c, the plugs 95a, 95b and 95c and the lead wires 97a, 97b, and 97c.

<A Method of Manufacturing a Thin Film Device>

Figure 2:
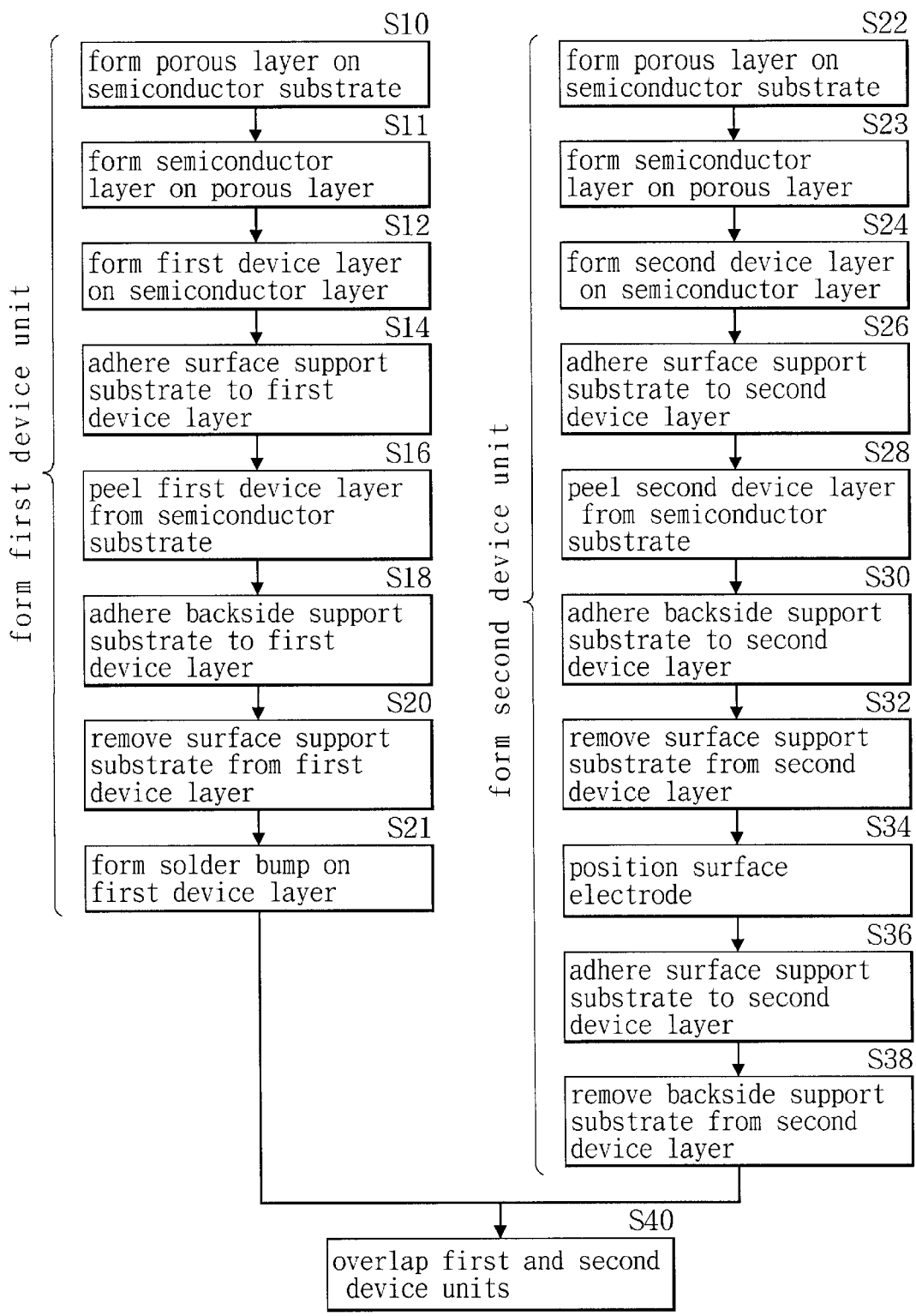
FIG. 2 is a flow sheet for illustrating a method of manufacturing a first device unit according to a method of manufacturing a thin film device of the first embodiment of the invention.

FIG. 2 is a flow sheet for illustrating a method of manufacturing a thin film device according to a first embodiment. The thin film device 1 of this embodiment is manufactured by adhering a first device unit 2 in which the first device layer 20 is supported by the backside support substrate and a second device unit 4 in which the second device layer 40 is supported by the surface support substrate.

<A Method of Manufacturing a First Device Unit>

Figure 3A:
FIGS. 3A through 3D are sectional views for illustrating a step of manufacturing method of FIG. 2.

First, description is made for a method of manufacturing the first device unit 2. FIGS. 3A through 3D to FIGS. 6A and 6B illustrate the sectional views for describing each step of method of manufacturing the first device unit 2. As shown in FIG. 3A, a semiconductor substrate 11 of p-type single crystal silicon having, for example, 100 crystal faces is used. Single crystal silicon doped with a p-type impurity such as boron (B) and having specific resistance in the order of 0.01 to 0.02 Ω19 cm is preferable.

A porous layer 12 is then formed on the surface of the semiconductor substrate 11 by anodization (S10). Anodization refers to a method in which the passage of current through a hydrofluoric acid solution using the semiconductor substrate 11 as an anode takes place. Anodization can be carried out by double cell method described in "Anodization of Porous Silicon" by Itoh et al., published in Surface Finishing Vol. 46, No. 5, pp. 8-13, 1995, for example. In this method, the semiconductor substrate 11 to be formed a porous layer is placed between two rooms in the cell and platinum rare electrodes connected to direct current power supply are placed in both rooms. Then, both rooms are filled with electrolytic solution and direct current voltage is applied to the platinum electrodes. The semiconductor substrate 11 is anodized and the platinum electrodes become cathode. Thus, the one side of the semiconductor substrate 11 is eroded and become porous.

Figure 3B:
Figure 3C:
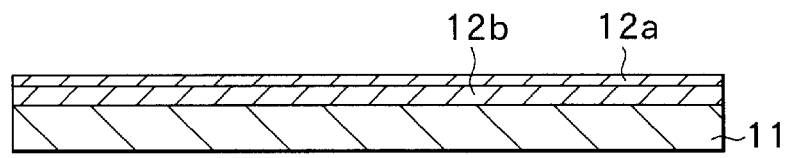
Figure 3D:
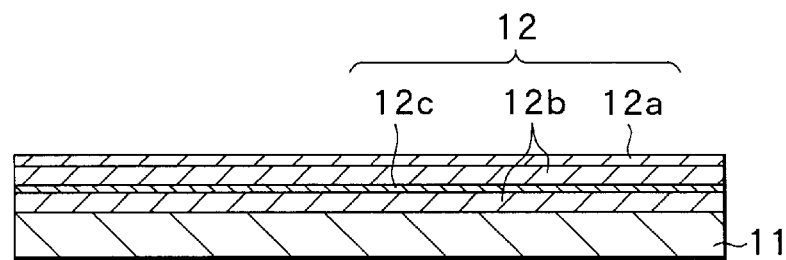

Specifically, for example, an electrolytic solution containing HF (hydrogen fluoride) and $C_2H_5OH$ (ethanol) at a ratio of 1 to 1 (volume ratio of 49% HF solution to 95% $C_2H_5OH$ solution) is used as an electrolytic solution (an anodization solution). First-step anodization takes place for 8 minutes at a current density of, for example, 1 mA/cm$^2$ to form a low porosity porous layer 12a having low porosity of, for example, about 16% in a thickness of 1.7 $\mu$m as shown in FIG. 3B. Second-step anodization then takes place for 8 minutes at a current density of, for example, 7 mA/cm$^2$ to form an intermediate porosity porous layer 12b having intermediate porosity of, for example, about 26% in a thickness of 6.3 $\mu$m as shown in FIG. 3C. Furthermore, third-step anodization takes place for a few seconds at a current density of, for example, 200 mA/cm$^2$ to from a high porosity porous layer 12c having high porosity of, for example, about 60 to 70% in a thickness of 0.05 $\mu$m as shown in FIG. 3D. The porous layer 12 of about 8 $\mu$m thick, which comprises three porous layers 12a, 12b and 12c each having different porosity, is thereby formed.

Subsequently, hydrogen annealing takes place for 30 minutes at a temperature of 1100° C., for example, thereby filling holes in the surface of the porous layer 12. Then, single crystal silicon is epitaxial grown on the porous layer 12 at a temperature of 1070° C. by using gas such as $SiH_4$ (silane), thereby the semiconductor layer 13 shown in FIG. 4A is formed (S11). In the area of the surface of the semiconductor layer 13 for forming the p channel-type transistor 20a (see FIG. 1), an n-type impurity ion is implanted and the n well 13a is formed.

As shown in FIG. 4B, the first device layer 20 is formed on the n well 13a of the semiconductor layer 13 (S12). Specifically, first, the isolate insulating film 21 is formed on the surface of the semiconductor layer 13 by LOCOS (Local Oxidation of Silicon). The gate insulating film 22a is formed in a region where the transistor 20a is formed by, for example, surface thermal oxidation of the semiconductor layer 13. On the gate insulating film 22a, the gate (word line) 23a is formed. Pattern etching by photolithography forms the gate 23a after forming polycrystal line silicon over the entire surface of the gate insulating film 22a by, for example, CVD (Chemical Vapor Deposition).

Using the gate 23a as a mask, the p areas 251 and 252 of p-type impurity areas having low concentration are formed in the semiconductor layer 13 by implanting a p-type impurity with relatively low concentration.

The p areas 251 and 252 become source and drain, respectively. A sidewall 24a made of silicon dioxide ($SiO_2$) is formed on the sides of the gate 23a. Using the sidewall 24a as a mask, a p-type impurity is ion-implanted with high concentration in both sides of the sidewall 24a. As a result, LDD (Lightly Doped Drain) structure in which the p areas 251 and 252 have higher impurity concentration in the area far from the gate 23a than in the area close to the gate 23a is obtained. Thereby, the p channel-type transistor 20a is formed.

The n channel-type transistor 20b is formed as the p channel-type transistor 20a. Specifically, the gate insulating film 22b is formed in a region where the transistor 20b is formed by, for example, surface thermal oxidation of the semiconductor layer 13. On the gate insulating film 22b, the gate 23b is formed. Using the gate 23b as a mask, the n areas 253 and 254 of n-type impurity areas having low concentration are formed in the semiconductor layer 13 by implanting relatively low concentration n-type impurity. The n areas 253 and 254 become source and drain, respectively. A sidewall 24b made of $SiO_2$ is formed on the sides of the gate 23b. Using the sidewall 24b as a mask, an n-type impurity is ion-implanted with high concentration in both sides of the sidewall 24b. As a result, above-described LDD structure is obtained.

As shown in FIG. 4C, the intermediate wiring layers 27a, 27b and 27c are formed after depositing and planarizing the first interlayer insulating layer 26 made of, for example, $SiO_2$. The intermediate wiring layers 27a and 27b are electrically connected to the p area 251 (source of the transistor 20a) and the n area 254 (drain of the transistor 20b), respectively through contact holes in the first interlayer insulating layer 26. The intermediate wiring layer 27c is electrically connected to both the p area 252 (drain of the transistor 20a) and the n area 253 (source of the transistor 20b) through the contact holes in the first interlayer insulating layer 26.

Figure 4D:
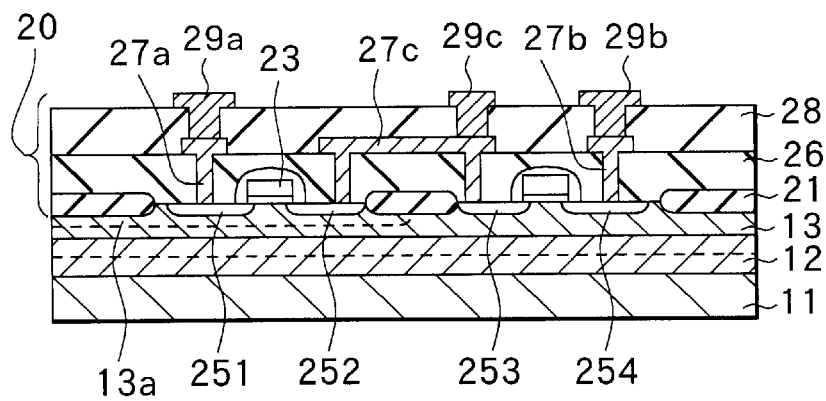

As shown in FIG. 4D, on the first interlayer insulating layer 26, the second interlayer insulating layer 28 made of, for example, $SiO_2$ is deposited and planarized and then the surface wiring layers 29a, 29b and 29c are formed thereon. The surface wiring layers 29a, 29b and 29c are electrically connected to the intermediate wiring layers 27a, 27b and 27c, respectively through contact holes in the second interlayer insulating layer 28. Thus, the first device layer 20 is formed.

Figure 5A:
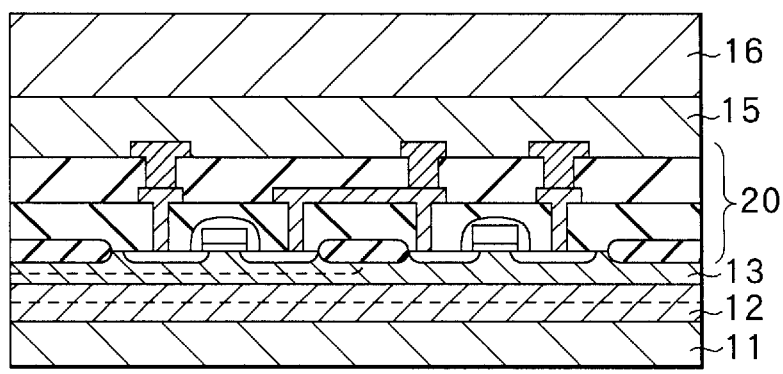
FIGS. 5A through 5C are sectional views for illustrating the step continued from FIGS. 9A through 4D.
Figure 5B:
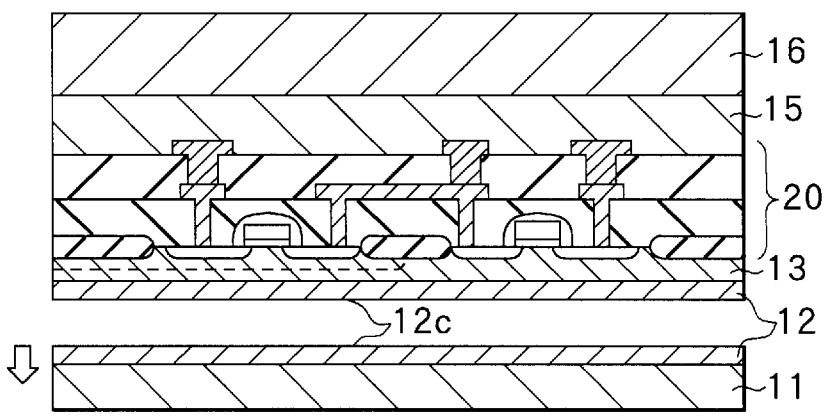

As shown in FIG. 5A, a surface support substrate 16 of, for example, a plastic substrate is adhered to the surface of the first device layer 20 by using an adhesive 15 having a melting point of about 70° C. (S14). Next, as shown in FIG. 5B, the first device layer 20 and the surface support substrate 16 are peeled from the semiconductor substrate 11 (S16). For peeling, three methods may be used. One is applying external force to the surface support substrate 16 and the semiconductor substrate 11 in the direction detaching each other. Second is weakening the strength of the porous layer 12 by soaking the semiconductor substrate 11 in solution such as water and ethanol and irradiating ultrasonic thereto. Third is weakening the strength of the porous layer 12 by applying centrifugal force to the semiconductor substrate 11. By these methods, the high porosity porous layer 12c of the porous layer 12 and its vicinity, that is, a rupture layer, are separated and the surface support substrate 16 is peeled from the semiconductor substrate 11 together with the first device layer 20. The adhesive 15 between the surface support substrate 16 and the first device layer 20 has adhesion to avoid that the surface support substrate 16 peels from the first device layer 20 in peeling the surface support substrate 16 and the first device layer 20 from the semiconductor substrate 11.

In order to peel the semiconductor substrate 11 by forming the rupture layer therein, so called smart cut method in which the rupture layer is formed in the vicinity of the surface of the semiconductor substrate 11 of single crystal silicon substrate by heat treatment at a temperature of, for example, 500° C., after hydrogen (H) is implanted in the vicinity of the surface of the semiconductor substrate 11 may be used. In this case, preferably, the first device layer 20 is formed at and below heat treatment temperature for forming the rupture layer, for example, 500° C.

Figure 5C:
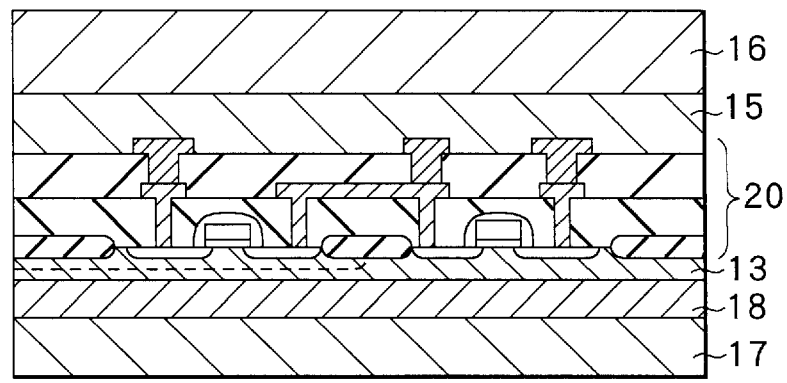
Figure 6A:
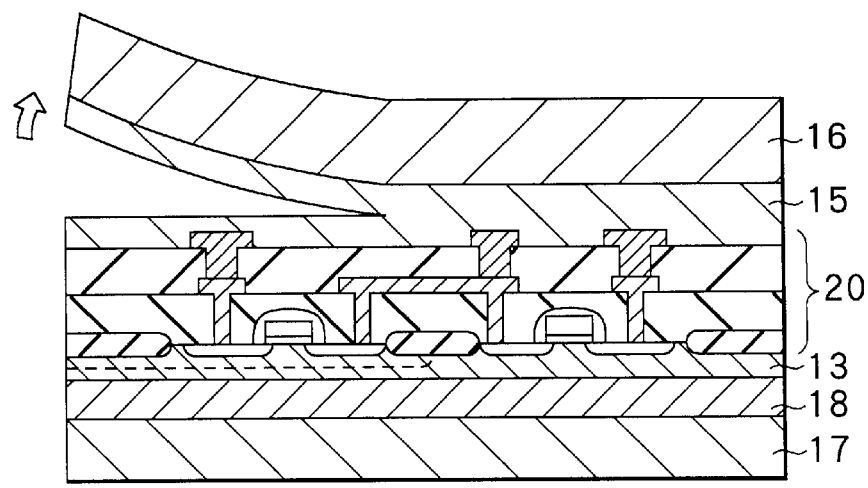
FIGS. 6A and 6B are sectional views for illustrating the step continued from FIGS. 5A through 5C.

The residue of the porous layer 12 attaching to the backside of the first device layer 20 is removed by etching. As shown in FIG. 5C, the backside support substrate 17 made of, for example, a plastic substrate is adhered to the backside of the first device layer 20 by using an adhesive 18 having a melting point of about 100° C. (S18). Subsequently, the entire device unit is heated at a temperature of, for example, 90° C. and the adhesive 15 between the surface support substrate 16 and the first device layer 20 is melted. The external force is applied to the surface support substrate 16 and the backside support substrate 17 in the direction detaching each other and thus the surface support substrate 16 is peeled from the first device layer 20 as shown in FIG. 6A (S20).

Figure 6B:
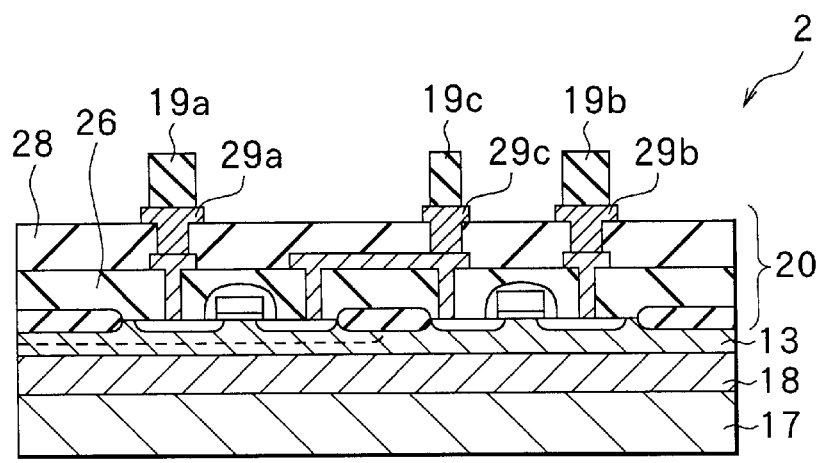

As shown in FIG. 6B, the solder bumps 19a, 19b and 19c are formed on the surface wiring layers 29a, 29b and 29c of the first device layer 20 after cleaning and removing the residue of the adhesive 15 attaching to the surface of the first device layer 20 (S21). Thus, the first device unit 2 in which the backside support substrate 17 supports the first device layer 20 is obtained.

<A Method of Manufacturing a Second Device Unit>

FIGS. 7A through 7D and FIGS. 8A to 8C illustrate the sectional views for describing each step of method of manufacturing the second device unit 4. The manufacturing process of the second device unit 4 includes the same steps (S22 to S32) as the steps S10 to S20 of the manufacturing process of the first device unit 2. Specifically, a porous layer 32 is formed on a surface of a semiconductor substrate 31 made of single crystal silicon by anodization (S22). On the porous layer 32, the semiconductor layer 33 made of single crystal silicon is formed by epitaxial growth (S23). The second device layer 40 is formed on a surface of the semiconductor layer 33 (S24).

A method of forming the second device layer 40 in the step S24 is the same as that of the first device layer 20 in the step S12 except that the step of fabricating the plugs 95a, 95b and 95c is added. First, the isolate insulating film 41 is formed on a surface of the semiconductor layer 33 by partly oxidation. The gate insulating films 42a and 42b are formed in a region where the transistor is formed by, for example, surface thermal oxidation of the semiconductor layer 33. On the gate insulating films 42a and 42b, the gate 43a is formed by, for example, CVD and photolithography. The p areas 451 and 452 are formed by implanting a p-type impurity on both bottom sides of the gate 43a of the semiconductor layer 33. The n areas 453 and 454 are formed by implanting an n-type impurity on both bottom sides of the gate 43b of the semiconductor layer 33. The sidewalls 44a and 44b made of, for example, $SiO_2$ are formed on the sides of the gates 43a and 43b. The first interlayer insulating layer 46 of, for example, $SiO_2$ is formed and the intermediate wiring layers 47a, 47b and 47c are formed thereon. In addition, the second interlayer insulating layer 48 of, for example, $SiO_2$ is formed and the surface wiring layers 49a, 49b and 49c are formed thereon.

After forming the second interlayer insulating layer 48; however before forming the surface wiring layers 49a, 49b and 49c, the plugs 95a, 95b and 95c are formed. Specifically, holes 96a, 96b and 96c are formed to penetrate the first interlayer insulating layer 46, the second interlayer insulating layer 48 and the semiconductor layer 33 by etching and the plugs 95a, 95b and 95c made of, for example, metal are formed therein through an insulating film.

Figure 7B:
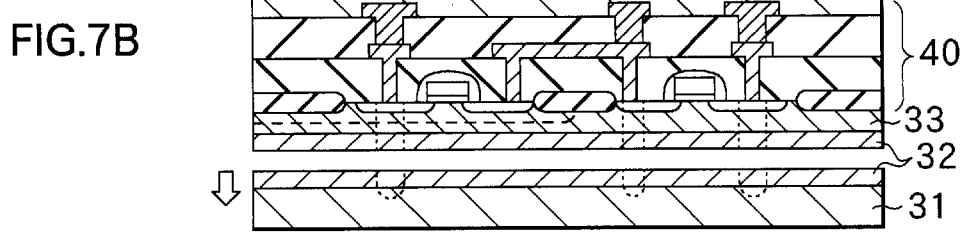

After forming the second device layer 40, as shown in FIG. 7B, a surface support substrate 36 of a plastic substrate is adhered to the surface of the second device layer 40 by using an adhesive 35 having a melting point of about 70° C. (S26). Next, the second device layer 40 and the surface support substrate 36 are peeled from the semiconductor substrate 31 (S28). For peeling, three methods may be used. One is applying external force to the surface support substrate 36 and the semiconductor substrate 31 in the direction detaching each other. Second is weakening the strength of the porous layer 32 by soaking the semiconductor substrate 31 in solution such as water and ethanol and irradiating ultrasonic thereto. Third is weakening the strength of the porous layer 32 by applying centrifugal force to the semiconductor substrate 31.

Figure 7C:
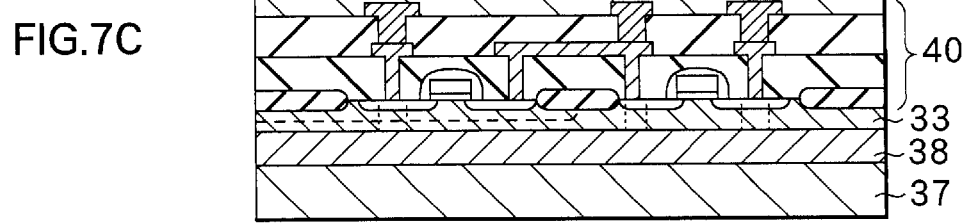
Figure 7D:
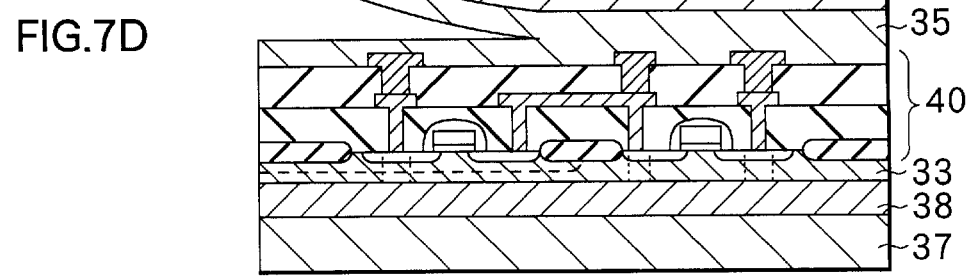

As shown in FIG. 7C, a backside support substrate 37 is adhered to the backside of the second device layer 40 by using an adhesive 38 having a melting point of about 100° C. (S30). As shown in FIG. 7D, the adhesive 35 between the surface support substrate 36 and the second device layer 40 is heated at a temperature of, for example, 90° C. and melted. At the same time, the external force is applied to the surface support substrate 36 and the backside support substrate 37 in the direction detaching each other and thus the surface support substrate 36 is peeled from the second device layer 40 (S32).

Figure 8A:
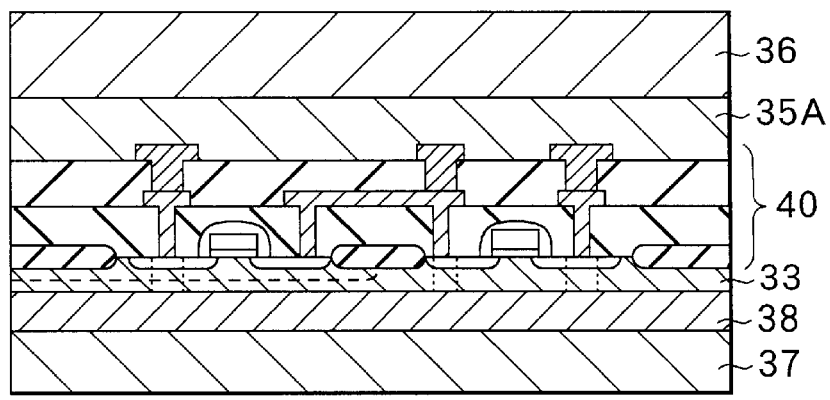
FIGS. 8A through 8C are sectional views for illustrating the step continued from FIGS. 7A through 7D.
Figure 8B:
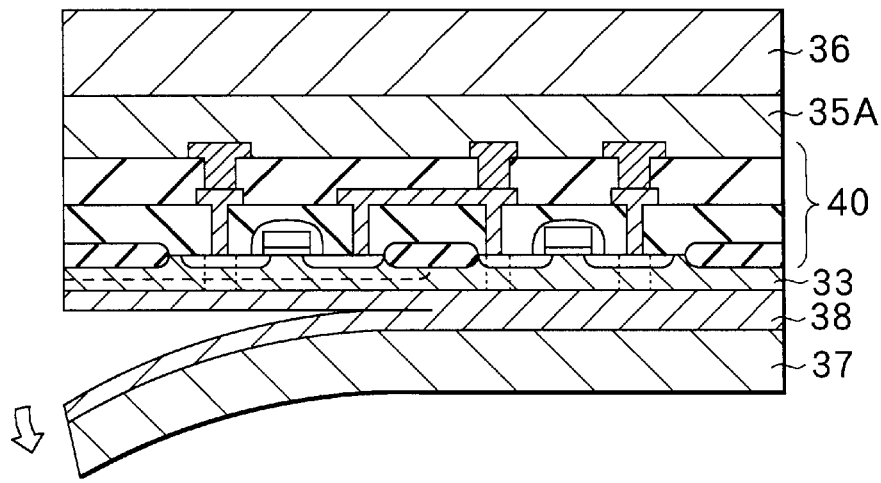
Figure 8C:
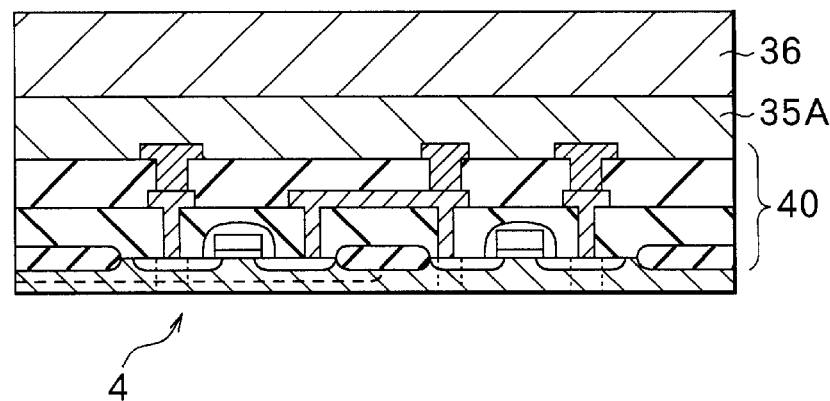

Subsequently, the process of position of a surface electrode is applied after cleaning and removing the residue of the adhesive 35 attaching to the surface of the second device layer 40 (S34). Specifically, the surface wiring layers 49a, 49b and 49c of the second device layer 40 and the lead wires 97a, 97b and 97c shown in FIG. 1 are respectively connected by solder using indium (In), for instance. As shown in FIG. 8A, the surface support substrate 36 is readhered to the surface of the second device layer 40 by using an adhesive 35A made of epoxy resin having a melting point of, for example, about 120° C. (S36). The adhesive 38 between the backside support substrate 37 and the second device layer 40 is heated at a temperature of, for example, 110° C. and melted. At the same time, the external force is applied to the surface support substrate 36 and the backside support substrate 37 in the direction detaching each other and thus the backside support substrate 37 is peeled from the second device layer 40 (S38), as shown in FIG. 8B. Thus, the second device unit 4 shown in FIG. 8C in which the surface support substrate 36 supports the second device layer 40 is obtained.

<A Method of Adhering the Device Units 2 and 4>

The first device unit 2 and the second device unit 4 manufactured as the above-described process are adhered to face the first device layer 20 and the second device layer 40 each other as shown in FIG. 9A (S40). The adhesive 39 for adherence of the device units 2 and 4 (see FIG. 9B) is made of epoxy resin, for instance.

Thus, as shown in FIG. 9B, the thin film device 1 having the structure of stacking the first device layer 20 and the second device layer 40 is obtained. The thin film device 1 may be supported by only one of the surface support substrate 36 or the backside support substrate 17. As a result, either the surface support substrate 36 or the backside support substrate 17 may be peeled off.

The first device layer 20 and the second device layer 40 correspond to a specific example of the "device layer" of the invention. The surface support substrate 36 and the backside support substrate 17 correspond to the specific examples of the "support substrate" and the "adhesive substrate" of the invention. Further, the first device unit 2 and the second device unit 4 correspond to a specific example of the "device unit" of the invention. The semiconductor substrates 11 and 31 correspond to a specific example of the "semiconductor substrate" of the invention.

Figure 10A:
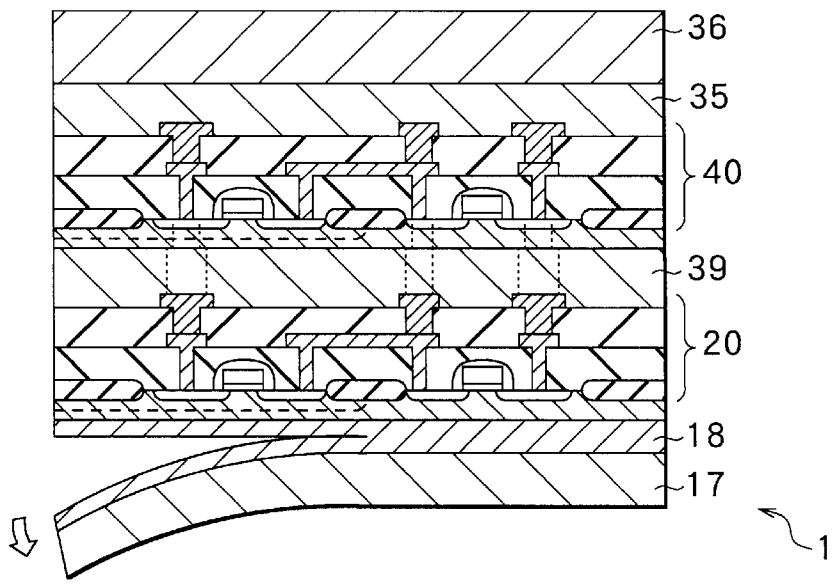
FIGS. 10A and 10B are sectional views for illustrating a method of manufacturing a thin film device having a triple-layer structure.
Figure 10B:
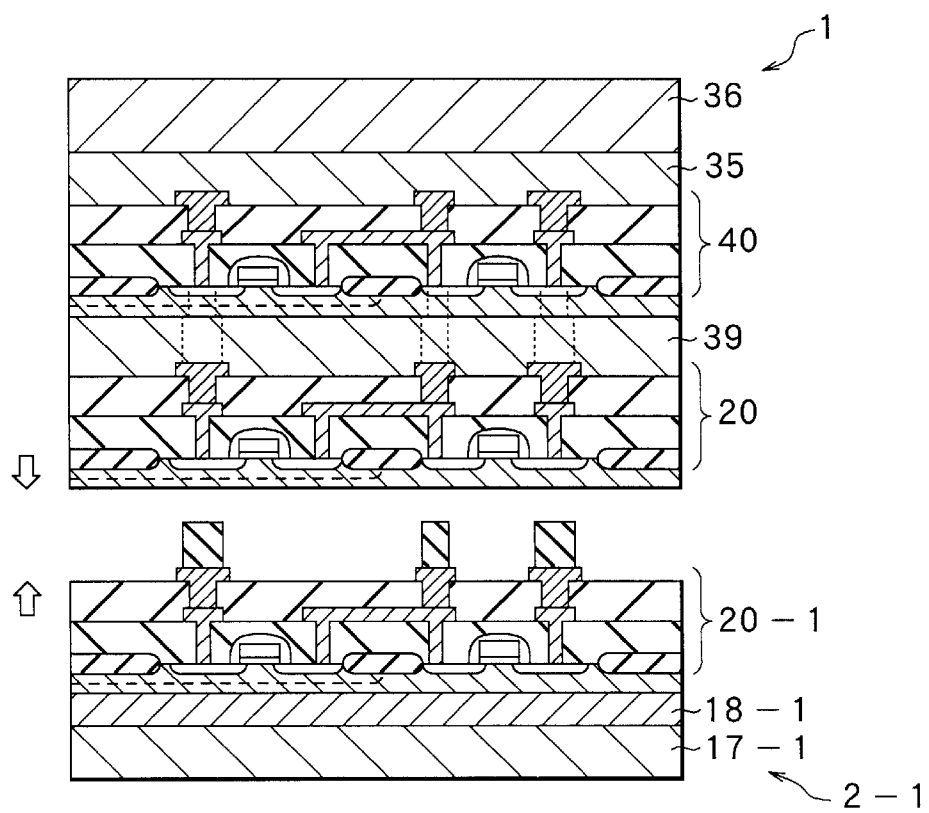

FIGS. 10A and 10B show a manufacturing process of a thin film device having a triple-layer structure. In manufacturing such a thin film device, first, as shown in FIG. 10A, the backside support substrate 17 is peeled from the thin film device 1 having the two-layered structure, for example, and the residue of the adhesive 18 attaching to the backside of the thin film device 1 is cleaned with ethyl alcohol or the like and removed. As shown in FIG. 10B, a third device unit 2-1 having the same configuration as the first device unit 2 (see FIG. 6B) is adhered to the backside of the thin film device 1, that is, the backside of the first device layer 20. The first device layer 20 and a device layer of the third device unit 2-1, which is indicated by reference character 20-1, are adhered to face each other. Thus, a thin film device having a triple-layer structure is obtained. A thin film device having more than three layers can be formed by repeating the above-described process, specifically, the backside support substrate or the surface support substrate of the thin film device is peeled off and other device unit is adhered. The kind of the stacking device layers may be different or the same.

As described above, according to a method of manufacturing a thin film device of the first embodiment, the thin film device 1 having a plurality of device layers 20 and 40 is manufactured by adhering the first device unit 2 and the second device unit 4. As a result, the method of forming the device layer is unlimited different from the related art, which forms a plurality of device layers in order. Consequently, the fast deposition can be used for forming the device layer. This enables to increase throughput in a manufacturing process of a thin film device. The various thin film devices are easy to manufactured by preparing the various device units comprising the device layers and the support substrates in advance and adhering these depending on its use. When defects are found in device layers, no device units having the defective device layers are adhered. This reduces the waste of materials.

In addition, the first device layer 20 and the second device layer 40 are supported by the support substrates 17 and 36, respectively in the first device unit 2 and the second device unit 4. As a result, thin first device layer 20 and the second device layer 40 of, for example, about 1 $\mu$m thick can be adhered. Further, it is easy to manufacture the thin film device having more than two layers by peeling the backside support substrate 17 or the surface support substrate 36 from the already stacked thin film device 1 and adhering other device units thereto.

[First Modification]

Figure 11:
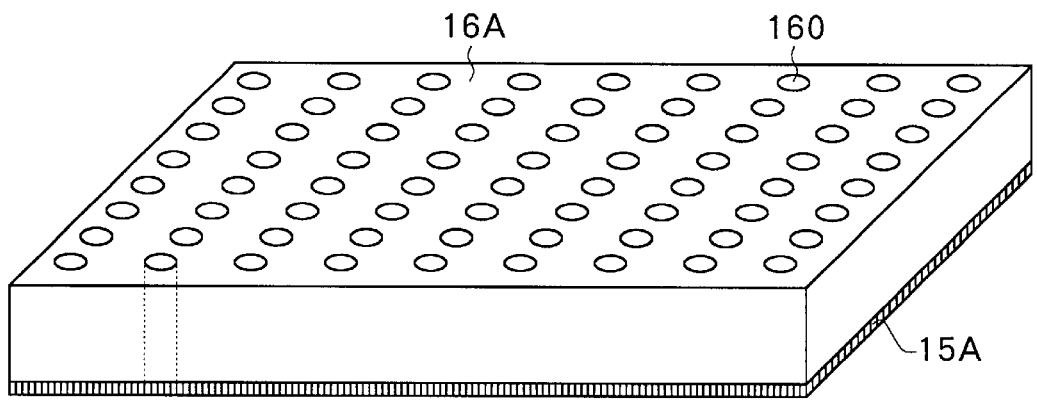
FIG. 11 is a perspective view for illustrating a surface support substrate according to a first modification of the first embodiment.

A first modification of the present embodiment is described with reference to FIG. 11 which shows a shape of a surface support substrate 16A of this modification. The surface support substrate 16A can replace the surface support substrate 16 (see FIG. 5A), for instance. Many holes 160 are formed in the entire surface support substrate 16A to penetrate its surface and backside. An adhesive 15A dissolving in a specific flux such as acetone is applied to the entire adhesive face of the surface support substrate 16A (bottom in FIG. 11) and the adhesive 15A adheres the surface support substrate 16A and the surface of the first device layer 20 (see FIG. 5A).

In the peeling of the surface support substrate 16A from the first device layer 20, application of flux such as acetone to the face of the surface support substrate 16A opposite to the adhesive 15A side dissolves the adhesive 15A by reaching the flux through the holes 160 with capillarity phenomenon or the like. The holes 160 formed in the entire surface of the surface support substrate 16A make it possible to spread the flux to the whole surface of the adhesive 15A equally and therefore the adhesive 15A can be dissolved efficiently. This enables to peel the surface support substrate 16A from the first device layer 20 with small external force. The structure of the surface support substrate 16A shown in FIG. 11 is applicable to the backside support substrate 17 of the first device unit 2 (see. FIG. 5C), and the surface support substrate 36 and the backside support substrate 37 of the second device unit 4 (see FIG. 8A).

[Second Modification]

Figure 12:
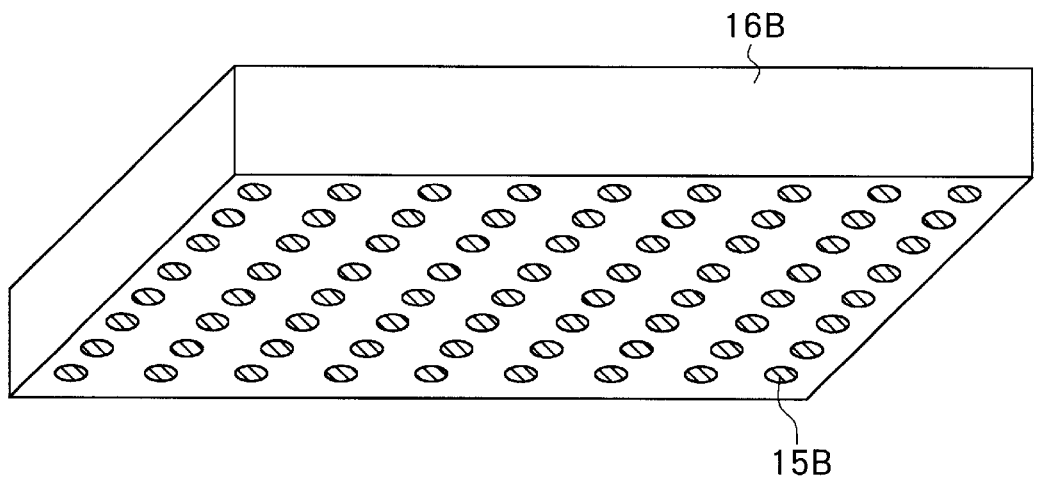
FIG. 12 is a perspective view for illustrating a surface support substrate according to a second modification of the first embodiment.

A second modification of the present embodiment is described with reference to FIG. 12 which shows a shape of a surface support substrate 16B of this modification. The surface support substrate 16B can replace the surface support substrate 16 (see FIG. 5A), for instance. An adhesive 15B dissolving in a specific flux such as acetone is scatteringly applied to the adhesive face of the surface support substrate 16B (bottom in FIG. 12) and the adhesive 15 adheres the surface support substrate 16B to the surface of the first device layer 20 (see FIG. 5A).

In the peeling of the surface support substrate 16B from the first device layer 20, the flux such as acetone is applied to the space between the surface support substrate 16B and the first device layer 20. The irregular space of the adhesive 15B in the adhesive surface of the surface support substrate 16B makes it easier to reach the flux to the whole adhesive 15B. As a result, the adhesive 15B can be dissolved quickly and therefore the surface support substrate 16B can be peeled from the first device layer 20 with small external force. The structure of the surface support substrate 16B shown in FIG. 12 is applicable to the backside support substrate 17 (see FIG. 5C), the surface support substrate 36 and the backside support substrate 37 (see FIG. 8A).

[Third Modification]

Figure 13:
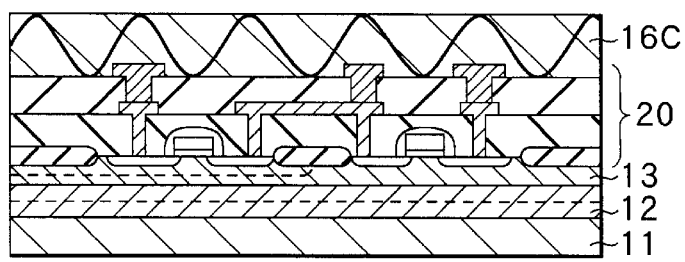
FIG. 13 is a sectional view for illustrating a surface support substrate according to a third modification of the first embodiment.

A third modification of the present embodiment is described with reference to FIG. 13 which shows a shape of a surface support substrate 16C of this modification. The surface support substrate 16C can replace the surface support substrate 16 (see FIG. 5A), for instance. The surface support substrate 16C is formed of reticulated cloth weaving thin line stainless, for instance. In this case, the surface support substrate 16C is impregnated with water in advance and placed directly on the first device layer 20 (see FIG. 5A). After that, the whole device is cooled to be a temperature of, for example, about −2° C. The water impregnated in the surface support substrate 16C is solidified and become ice and therefore the surface support substrate 16C is adhered to the first device layer 20 by the adhesion of the ice.

After adhering the surface support substrate 16C to the first device layer 20, the device is further cooled by using liquid nitrogen or the like. This contracts the volume by further solidifying the surface support substrate 16C. If the surface support substrate 16C is contracted, the first device layer 20 is varied as the surface support substrate 16C is varied because the thickness of the first device layer 20 is extremely thin. However, the semiconductor substrate 11 (see FIG. 5A) is not varied. As a result, the porous layer 12 between the first device layer 20 and the semiconductor substrate 11 is destructed and peeled. Further, the adhesion of ice between the surface support substrate 16C and the first device layer 20 is dissolved by heating the surface support substrate 16C to a temperature of, for example, 20° C. Therefore, the surface support substrate 16C can be peeled from the first device layer 20.

According to the modification, the surface support substrate 16C is adhered to the first device layer 20 by using water. As a result, it is possible for the surface support substrate 16C to adhere to and separate from the first device layer 20, and to peel from the semiconductor substrate 11 by only temperature control. The structure of the surface support substrate 16C shown in FIG. 13 is applicable to the backside support substrate 17 (see. FIG. 5C), the surface support substrate 36 and the backside support substrate 37 (see FIG. 8A). The material of the surface support substrate 16C is not limited to the cloth but a material capable of impregnating liquid such as paper may be used.

[Fourth Modification]

Fourth modification is described with reference to FIG. 5A. In the modification, an adhesive dissolving in water such as paste is used as the adhesive 15 for adhering the surface support substrate 16 to the first device layer 20. Cleaning of the surface of the first device layer 20 is easier after peeling the surface support substrate 16 from the first device layer 20 since the paste can be removed by cleaning with pure water. However, the adhesion of the paste is relatively weak. As a result, in the peeling of the first device layer 20 from the semiconductor substrate 11, a method requiring small external force to the surface support substrate 16 and the first device layer 20 in which the porous layer 12 is destructed in alcohol by, for example, ultrasonic is used.

[Fifth Modification]

Fifth modification is described with reference to FIG. 5A. In the modification, an adhesive having a characteristic of exhibiting a high adhesion at room temperature (for example, 20° C.) and a low adhesion under high temperature is used as the adhesive 15 for adhering the surface support substrate 16 to the first device layer 20. An example of such adhesive is temperature sensitive adhesive Intelimer (Trade Mark; Nitta Corporation) developed by Landec Corporation in the United States. This adhesive exhibits high adhesion under room temperature (for example, 30 g/mm); however, the adhesion is reduced by one tenth or less under a temperature of 50° C. or more (for example, 3 g/mm at a temperature of 60° C.).

In the case of using the above-mentioned adhesive, the surface support substrate 16 is adhered to the first device layer 20 at room temperature, that is, a temperature the adhesive keeps high adhesion. On the other hand, the surface support substrate 16 is peeled from the first device layer 20 at a temperature of 60° C., namely, a temperature the adhesive reduces the adhesion. Thus, it is easy for the surface support substrate to adhere to and separate from the first device layer by temperature control in a relatively narrow range of temperature.

[Sixth Modification]

Sixth modification is described with reference to FIG. 6A. In the modification, wax having a softening point of, for example, 49° C. is used as the adhesive 15 for adhering the surface support substrate 16 to the first device layer 20. The wax is heated to at least its softening point for adherence. After the adherence, when temperature is lowered to, for example, room temperature, the wax is hardened and therefore the surface support substrate 16 is adhered firmly to the first device layer 20. In the peeling, the wax is reheated to at least its softening point to weaken its adhesion. This makes it easy to peel the surface support substrate 16 from the first device layer 20.

Natural wax made of rosin, solid wax made of synthetic resin or the like are used as the wax. Considering the later-described process of peeling of the surface support substrate 16 from the first device layer 20, water-soluble wax having relatively low softening point is desirable.

[Seventh Modification]

Seventh modification is described with reference to FIG. 6A. In the modification, an adhesive tape applied adhesive, which is reduced adhesion by ultraviolet irradiation, may be used as the adhesive 15 for adhering the surface support substrate 16 to the first device layer 20. Examples of such adhesive tapes are TV hardening type BG protective tape E-2142 (Trade Mark), UV hardening type dicing tape D-210 (Trade Mark) developed by Lintec Corporation and so on. In the peeling, ultraviolet is irradiated to the adhesive tape to weaken its adhesion. This makes it easy to peel the surface support substrate 16 from the first device layer 20

[Second Embodiment]

Reference is made to FIG. 14 to FIGS. 15A through 15C, describing a second embodiment of the invention. In this embodiment, a first device unit 2A is adhered to the second device unit 4. The second device unit 4 has the same configuration as that of the first embodiment. On the other hand, the first device unit 2A is formed by forming the first device layer 20 on the semiconductor substrate 11 as different from the structure of the first embodiment. The same components as the first embodiment are indicated by the same reference characters, and the description thereof is omitted.

Figure 14:
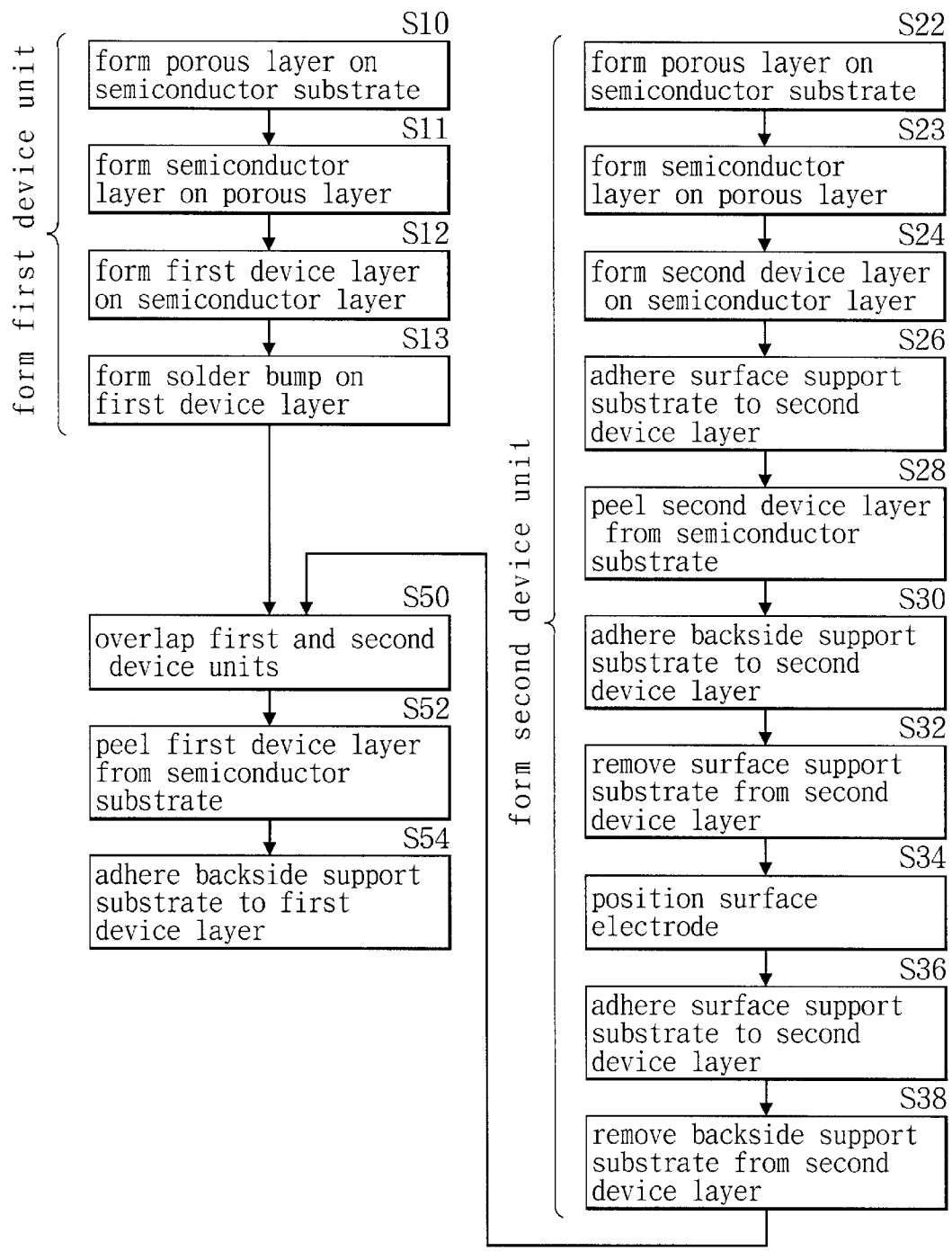
FIG. 14 is a flow sheet for illustrating a method of manufacturing a thin film device according to a second embodiment of the invention.
Figures 15A, 15B, 15C:
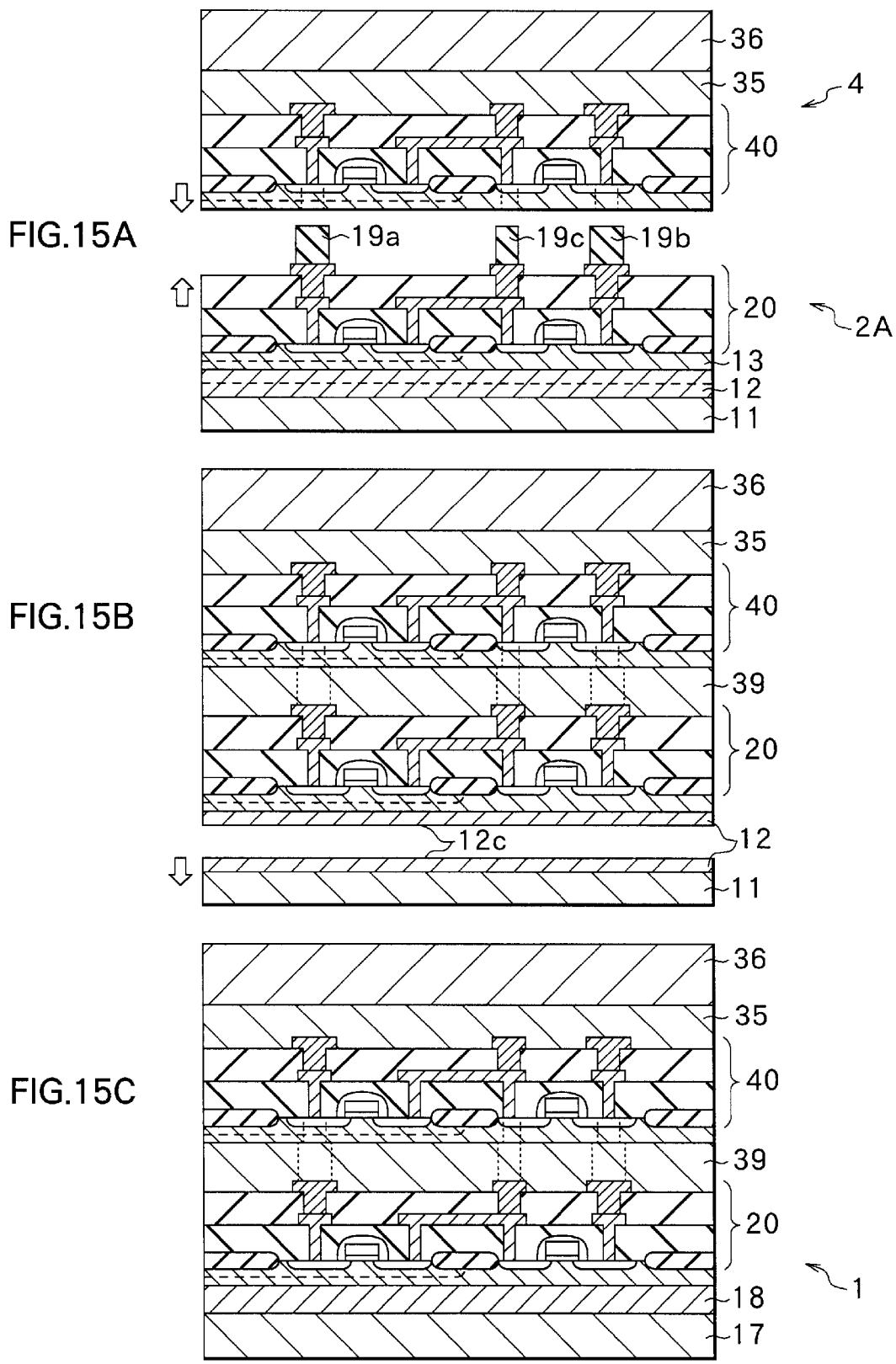
FIGS. 15A through 15C are sectional views for illustrating a step of manufacturing method of FIG. 14.

FIG. 14 is a flow sheet for illustrating a method of manufacturing a device layer according to a second embodiment and FIGS. 15A through 15C are sectional views for illustrating each step of manufacturing method of FIG. 14. First, the first device unit 2A is manufactured as the steps S10 to S16 in the first embodiment. Specifically, the porous layer 12 is formed on the surface of the semiconductor substrate 11 (S10) and then the semiconductor layer 13 is formed thereon (S11). On the semiconductor layer 13, the first device layer 20 is formed (S12). However, no steps of S14 to S21 in the first embodiment, which is the adherence of the surface support substrate 16 to the first device layer 20 and the like, are performed. The solder bump is formed on the surface of the first device layer 20 (S13). Thus, the first device unit 2A in which the semiconductor substrate 11 supports the first device layer 20 is obtained.

Subsequently, the second device unit 4 is manufactured as the steps S22 to S38 in the first embodiment.

As shown in FIG. 15A, the first device unit 2A and the second device unit 4 are adhered to face the first device layer 20 and the second device layer 40 each other (S50). The adhesive 39 for adhering the device units 2A and 4 is made of epoxy resin, for instance. Thus, the structure that the device layers 20 and 40 are stacked on the semiconductor substrate 11 is obtained.

As shown in FIG. 15B, the first device layer 20 is peeled from the semiconductor substrate 11 together with the second device layer 40 and the surface support substrate 36 (S52). Like the first embodiment, three methods may be used for peeling. One is applying external force to the surface support substrate 36 and the semiconductor substrate 11 in the direction detaching each other. Second is weakening the strength of the porous layer 12 by soaking the semiconductor substrate 11 in solution such as water and ethanol and irradiating ultrasonic thereto. Third is weakening the strength of the porous layer 12 by applying centrifugal force to the semiconductor substrate 11.

As shown in FIG. 15C, the backside support substrate 17 is adhered to the backside of the first device layer 20 with the adhesive 18 made of, for example, epoxy resin after removing the residue of the porous layer 12 attaching to the backside of the first device layer 20 by etching (S54). Thus, the thin film device in which the first device layer 20 and the second device layer 40 are stacked is obtained.

The surface support substrate 36 and the semiconductor substrate 11 correspond to a specific example of the "support substrate" of the invention. The first device unit 2A and the second device unit 4 correspond to a specific example of the "device unit" of the invention.

In the above-described second embodiment, the device unit 2A comprises the first device layer 20 and the semiconductor substrate 11 and peeled from the semiconductor substrate 11 after adhering the first device unit 2A to the second device unit 4. As a result, there is no need to adhere the surface support substrate to the first device layer 20. As compared to the first embodiment, fewer materials are used in the manufacturing process.

[First Modification]

Figure 16:
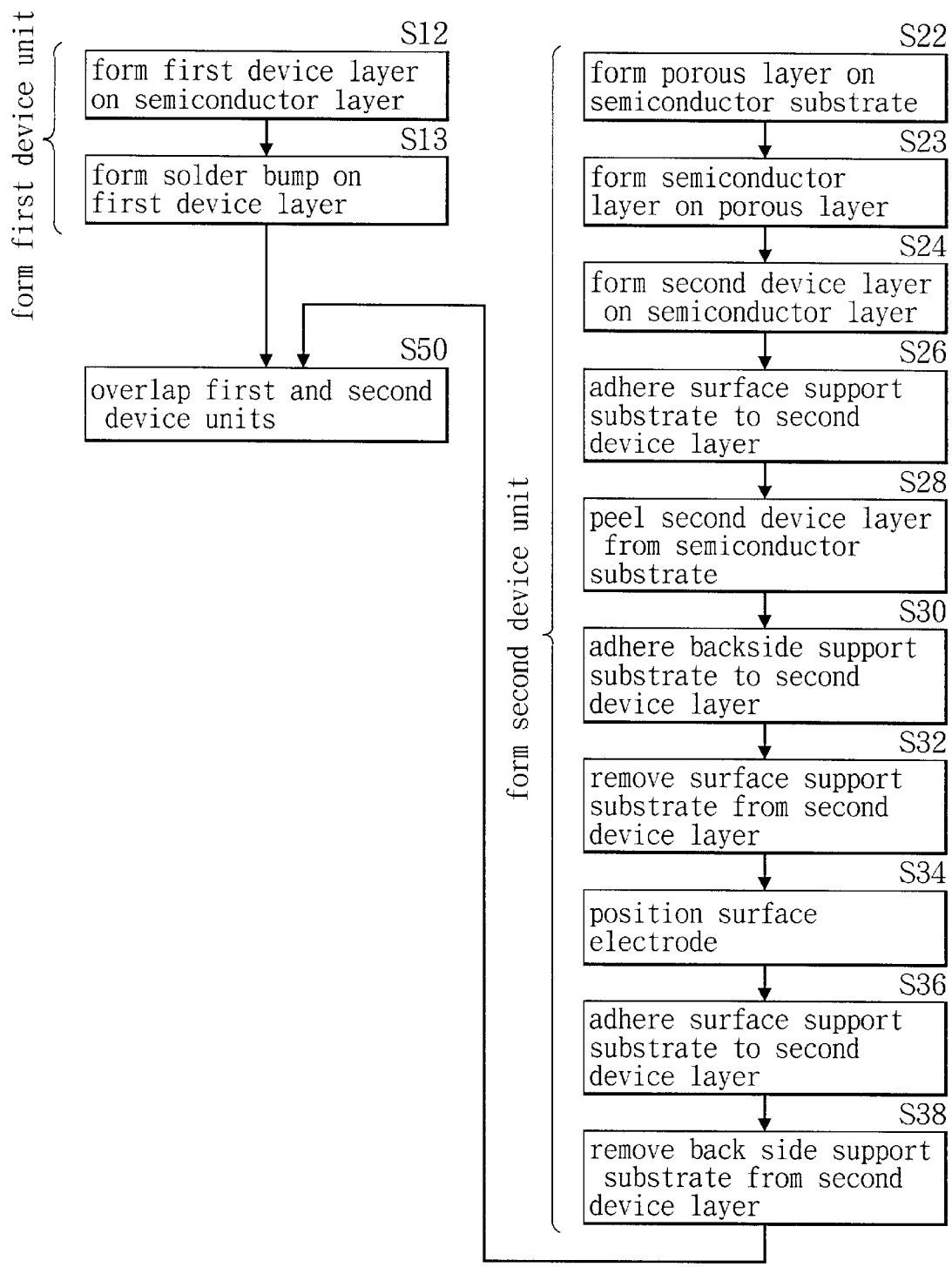
FIG. 16 is a flow sheet for illustrating a first modification of a method of manufacturing a thin film device according to the second embodiment.

A first modification of the second embodiment is described with reference to FIG. 16 which is a flow sheet for illustrating a modification of a method of manufacturing a device layer according to the second embodiment. In the modification, the first device layer 20 is formed on the surface of the semiconductor substrate 11 without the porous layer 12 therebetween (S12) in forming the first device unit 2A. On the surface of the first device layer 20, the solder bump is formed like the second embodiment (S13), thereby the first device unit 2A is obtained. The second device unit 4 is manufactured as the steps of S22 to S38 in the second embodiment.

Similar to the second embodiment, the first device unit 2A and the second device unit 4 are adhered to face the first device layer 20 and the second device layer 40 each other (S50). The first device unit 2A and the second device unit 4 are unpeeled from the semiconductor substrate 11 as different from the second embodiment. Thus, the thin film device having the structure that the device layers 20 and 40 are stacked on the semiconductor substrate 11 is obtained.

According to the modification, it is easier to manufacture the device since the first device layer 20 is formed on the semiconductor layer 11 as compared to a general method.

[Second Modification]

Figure 17A:
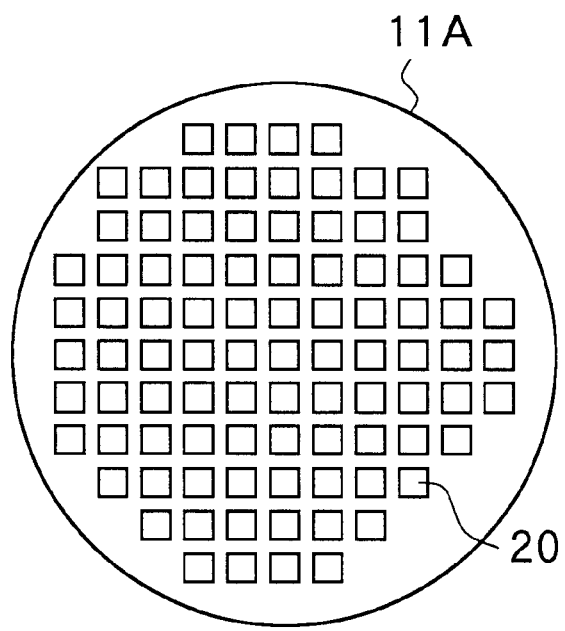
FIGS. 17A and 17B are views for illustrating a second modification of a method of manufacturing a thin film device according to the second embodiment.
Figure 17B:
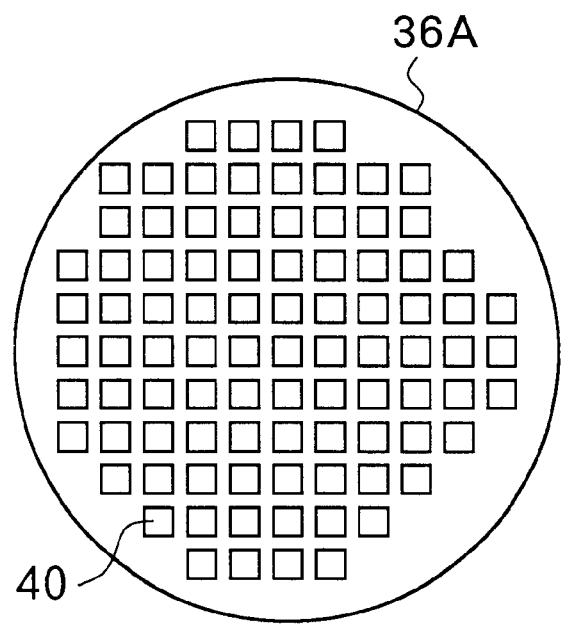

Referring to FIGS. 17A and 17B, a second modification of the second embodiment is described. FIGS. 17A and 17B respectively show a semiconductor substrate 11A and a surface support substrate 36A according to a second modification. As shown in FIG. 17A, the semiconductor substrate 11A is formed relatively large and a plurality of first device layers 20 (90 layers, for example) can be formed thereon. As shown in FIG. 17B, the surface support substrate 36A has almost the same size as the semiconductor substrate 11A and a plurality of second device layers 40 (90 layers, for example) can be adhered to its backside. Each of the first device layer 20 and the second device layer 40 has an identical area. Each position of the first device layer 20 on the semiconductor substrate 11A and the second device layer 40 adhered to the surface support substrate 36A coincide mutually.

According to the modification, a plurality of the stacks of the first device layers 20 and the second device layers 40 (90 stacks, for example) are formed by adhering the semiconductor substrate 11A to the surface support substrate 36A to overlap. The first device layer 20 and the second device layer 40 are electrically connected each other through the unshown solder bump. When cut the semiconductor substrate 11A and the surface support substrate 36A to separate adjacent stacks, a plurality of thin film devices 1 (90 devices, for example) including the first device layers 20 and the second device layers 40 are manufactured. In other words, many thin film devices 1 are formed with simple method according to the modification.

[Third Modification]

Figure 18A:
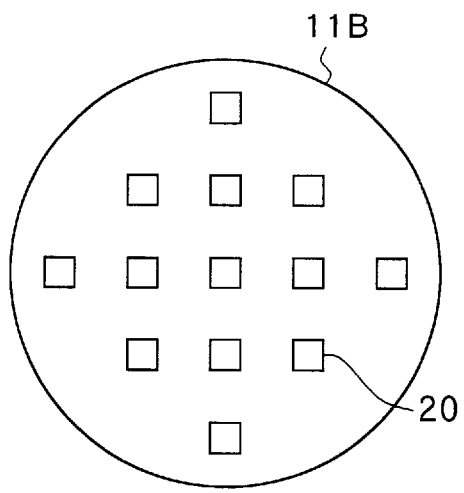
FIGS. 18A and 18B are views for illustrating a third modification of a method of manufacturing a thin film device according to the second embodiment.
Figure 18B:
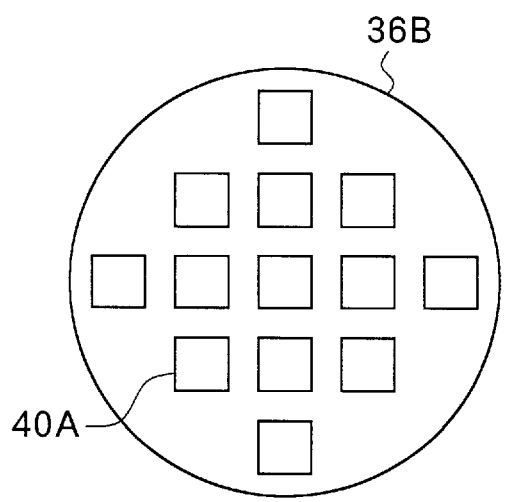
Figure 19:
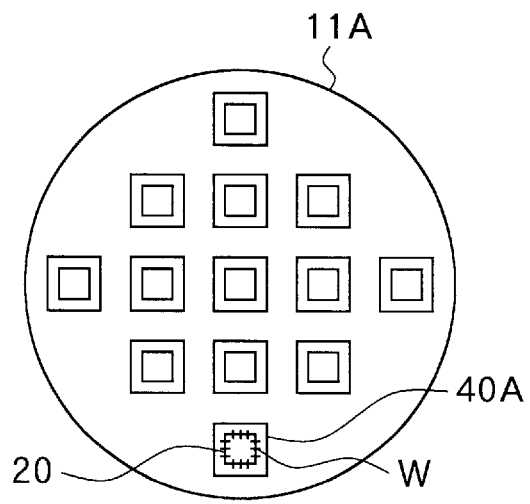
FIG. 19 is a view for illustrating a state overlapping the semiconductor substrate and the surface support substrate shown in FIGS. 18A and 18B.

Referring to FIGS. 18A and 18B, a third modification of the second embodiment is described. FIGS. 18A and 18B respectively show a semiconductor substrate 11B and a surface support substrate 36B. Similar to the second modification, a plurality of first device layers 20 is formed on the semiconductor substrate 11B (see FIG. 18A) and a plurality of second device layers 40A is adhered to the surface support substrate 36B (see FIG. 18B). In the above-mentioned second modification, although the first device layer 20 and the second device layer 40 have the same area, the second device layer 40A is large than the first device layer 20 in this modification. In this case, when the first device layer 20 is adhered to the second device layer 40A, the periphery of the second device layer 40A extends from that of the first device layer 20 as shown in FIG. 19. As a result, wire bonding indicated by W in FIG. 19 is applied to the periphery of first device layer 20 and the extended periphery of the second device layer 40A.

According to the modification, there is no need to use the solder bump at the time of adherence of the first device layer 20 to the second device layer 40A. This enables easy adherence. The first device layer 20 may be formed larger than the second device layer 40A reverse to FIGS. 18A and 18B.

[Third Embodiment]

Figure 20:
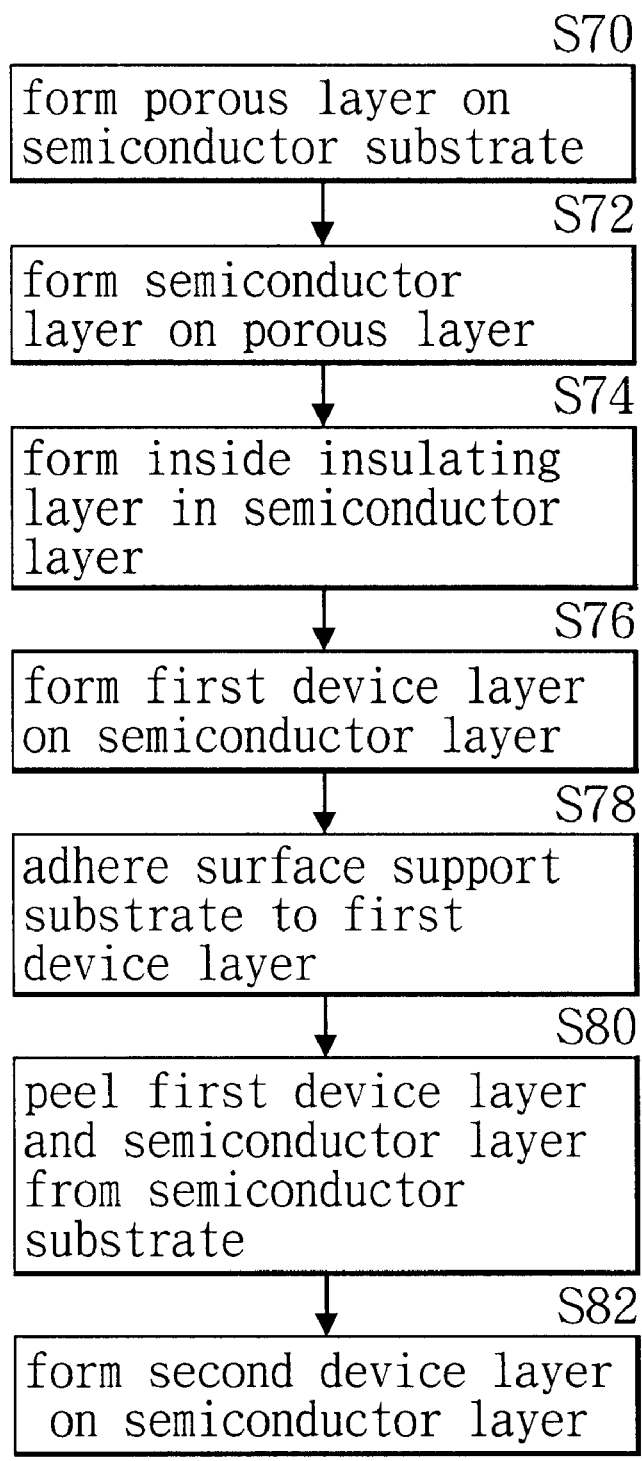
FIG. 20 is a flow sheet for illustrating a method of manufacturing a thin film device according to a third embodiment of the invention.

Reference is made to FIG. 20 to FIGS. 22A and 22B, describing a third embodiment of the invention. In this embodiment, the device layers are formed on surface and on backside of a semiconductor layer, respectively. FIG. 20 is a flow sheet for illustrating a method of manufacturing a device layer according to a third embodiment and FIGS. 21A through 21D are sectional views for illustrating each step of manufacturing method of FIG. 20. Description is made for the different points from the first and the second embodiments and other description is omitted.

Figure 21A:
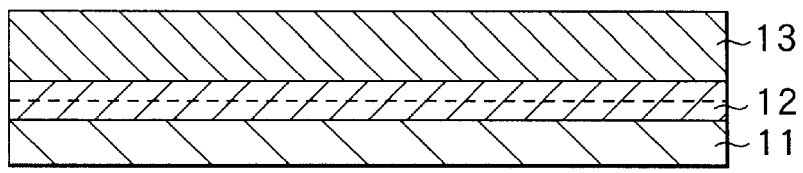
FIGS. 21A through 21D are sectional views for illustrating a step of manufacturing method of FIG. 20.
Figure 21B:
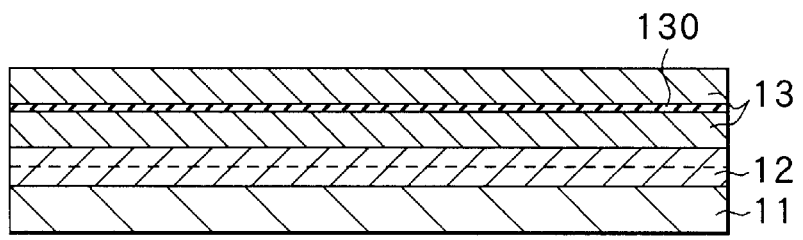
Figure 21C:
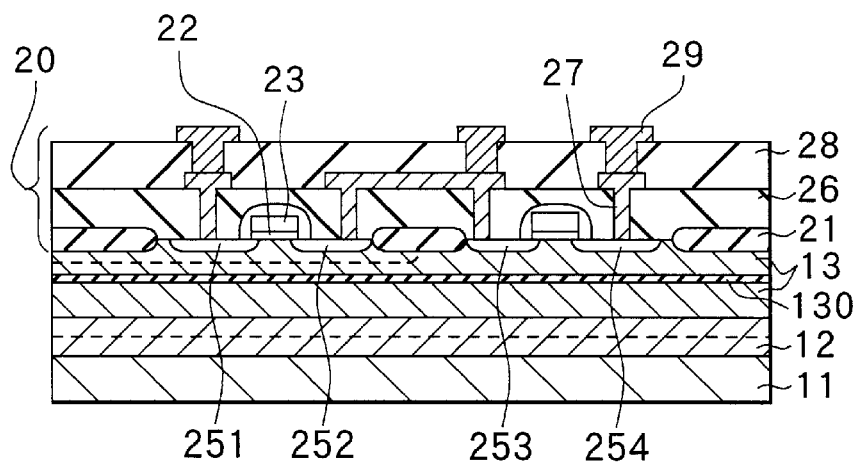

As shown in FIG. 21A, the porous layer 12 is formed on the surface of the semiconductor substrate 11 formed like the first embodiment by anodization (S70). On the porous layer 12, the semiconductor layer 13 is formed by epitaxial growth (S72). As shown in FIG. 21B, an inside insulating layer 130 made of an insulating material is formed in the semiconductor layer 13 by ion implantation with the same method as forming SIMOX (Separation by Implanted Oxygen) wafer, for instance (S74). As shown in FIG. 21C, on the semiconductor layer 13, the first device layer 20 having the same structure as the first embodiment is formed (S76). The description of the configuration of the first device layer 20 is omitted.

Figure 21D:
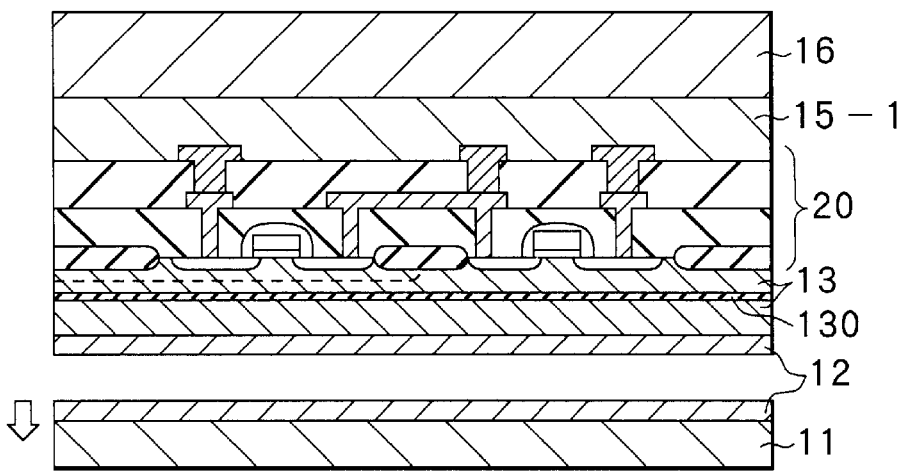

As shown in FIG. 21D, the surface support substrate 16 of, for example, a heat resistance plastic substrate or a glass substrate is adhered to the surface of the first device layer 20 with the adhesive 15 made of, for example, epoxy resin or with glass fusion (S78). Next, the surface support substrate 16 is peeled from the semiconductor substrate 11 together with the first device layer 20 (S80). For the peeling, three methods may be used. One is applying external force to the surface support substrate 16 and the semiconductor substrate 11 in the direction detaching each other. Second is weakening the strength of the porous layer 12 by soaking the semiconductor substrate 11 in solution such as water and ethanol and irradiating ultrasonic thereto. Third is weakening the strength of the porous layer 12 by applying centrifugal force to the semiconductor substrate 11.

Figure 22A:
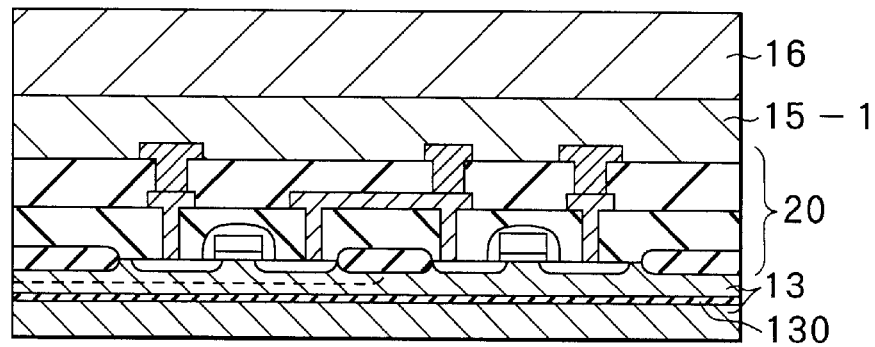
FIGS. 22A and 22B are sectional views for illustrating the step continued from FIGS. 21A through 21D.
Figure 22B:
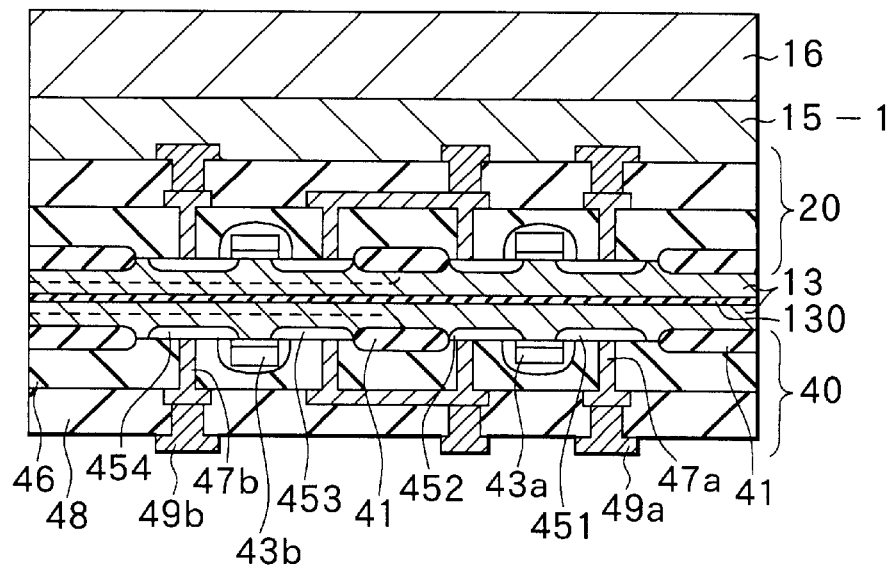

As shown in FIG. 22A, the residue of the porous layer 12 attaching to the backside of the semiconductor layer 13 is removed by etching or the like. As shown in FIG. 22B, the second device layer 40 having the same structure as the first embodiment is formed on the backside of the semiconductor layer 13 (S82). Thus, the thin film device 1 in which the first device layer 20 and the second device layer 40 are formed on the backside of the semiconductor substrate 11 is formed.

The semiconductor layer 13 corresponds to a specific example of the "semiconductor layer" of the invention and the inside insulating layer 130 corresponds to a specific example of the "inside insulating layer" of the invention. Additionally, the first device layer 20 and the second device layer 40 correspond to the specific examples of the "first device layer" and the "second device layer" of the invention, respectively.

According to the embodiment, a semiconductor layer 13 comprises the device layer 20 and the device layer 40 on its surface and backside, respectively. As a result, it is easy to form a thin film device having a multi-layered structure. The device layers 20 and 40 are electrically isolated each other by the inside insulating layer 130 disposed in the semiconductor layer 13.

[Fourth Embodiment]

Reference is made to FIGS. 23A through 23D to FIGS. 27A and 27B, describing a fourth embodiment of the invention. The thin film device of the fourth embodiment integrates a photo diode and a laser diode.

Figure 23A:
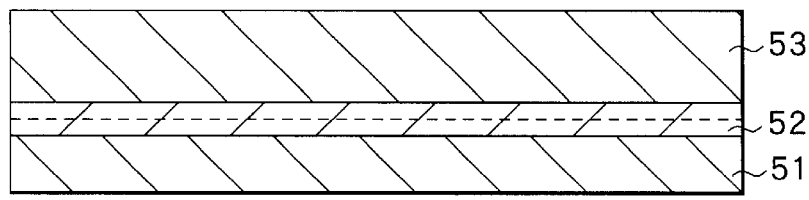
FIGS. 23A through 23D are sectional views for illustrating a method of manufacturing a first device unit according to a method of manufacturing a thin film device of a forth embodiment of the invention.
Figure 23B:
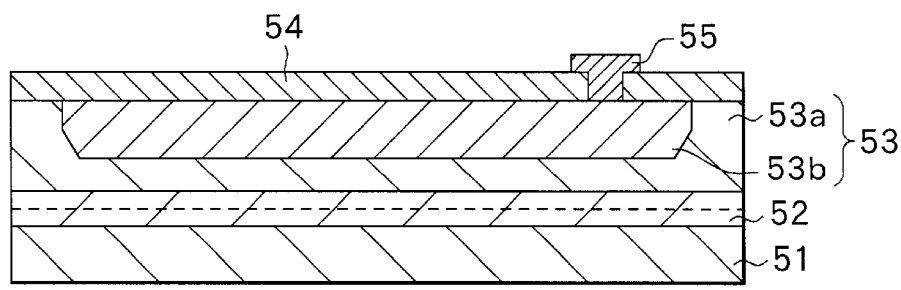

FIGS. 23A through 23D are sectional views for illustrating each step of a method of manufacturing a photo diode 50. As shown in FIG. 23A, a p$^+$-type single crystal silicon substrate having specific resistance of about 0.01 Ω·cm is used as a semiconductor substrate 51, for instance. On the surface of the semiconductor substrate 51, a porous layer 52 is formed by anodization like the first embodiment. Subsequently, hydrogen annealing takes place for 30 minutes at a temperature of 1100° C., for example, thereby filling holes in the surface of the porous layer 52. Then, single crystal silicon is epitaxial grown on the porous layer 52 at a temperature of 1070° C. by using gas such as SiH$_4$ (silane), thereby a semiconductor layer 53 having a thickness of, for example, 10 μm is formed. As shown in FIG. 23B, an n area 53a is formed by implanting an n-type impurity such as phosphorus (P) to the semiconductor layer 53. A p area 53b is formed by implanting a p-type impurity such as boron (B) to the surface of the semiconductor layer 53 through a predetermined pattern (not shown).

Figure 23C:
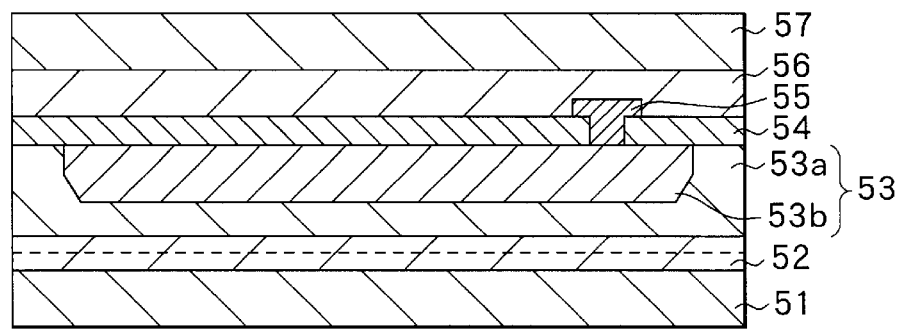

On the p area 53b, a protective layer 54 made of transparent epoxy resin is formed and an electrode layer 55 of metal is formed thereon in a predetermined pattern. The electrode layer 55 is in contact with the surface of the p area 53b through a contact hole formed in the protective layer 54. As shown in FIG. 23C, on the protective layer 54, a surface support substrate 57 of a plastic film is adhered with an adhesive 56, which is reduced adhesion by cooling at a low temperature, for example, below room temperature. A specific example of such adhesive is temperature sensitive adhesive Intelimer cool off type (Trade Mark; Nitta Corporation) developed by Landec Corporation in the United States.

Figure 23D:
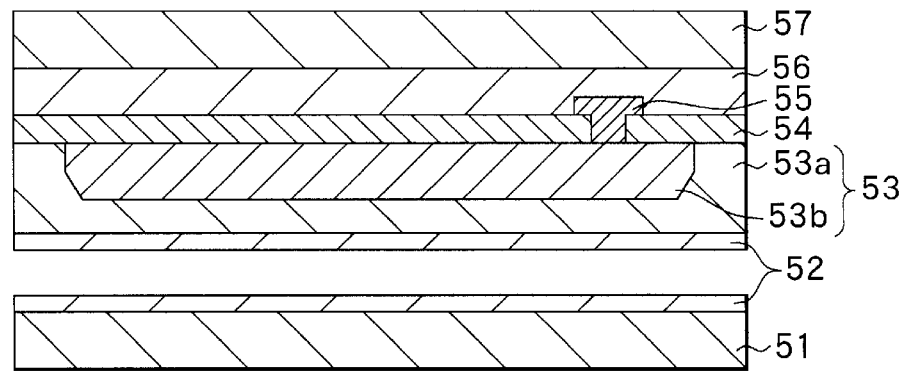

As shown in FIG. 23D, the surface support substrate 57 and the semiconductor substrate 53 are peeled from the semiconductor substrate 51. Three methods are used for the peeling similar to the first embodiment, for instance. One is applying tensile stress between the surface support substrate 57 and the semiconductor substrate 51. Second is weakening the strength of the porous layer 52 by soaking the semiconductor substrate 51 in solution such as water and irradiating ultrasonic thereto. Third is weakening the strength of the porous layer 52 by applying centrifugal force to the semiconductor substrate 51. The residue of the porous layer 52 attaching to the backside of the semiconductor layer 53 is removed by etching with mixed water solution of hydrofluoric acid, nitric acid and acetic acid.

Figure 24A:
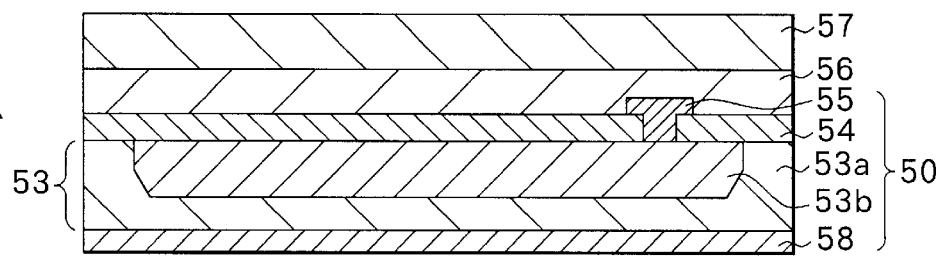
FIGS. 24A through 24C are sectional views for illustrating the step continued from FIGS. 23A through 23D.
Figure 24B:
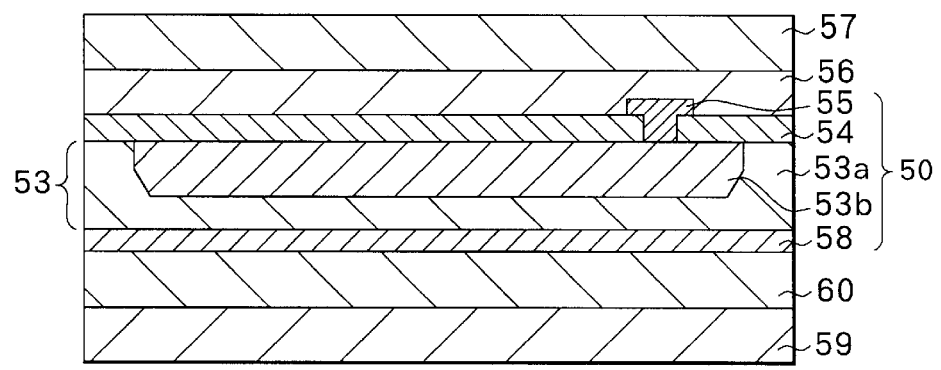
Figure 24C:
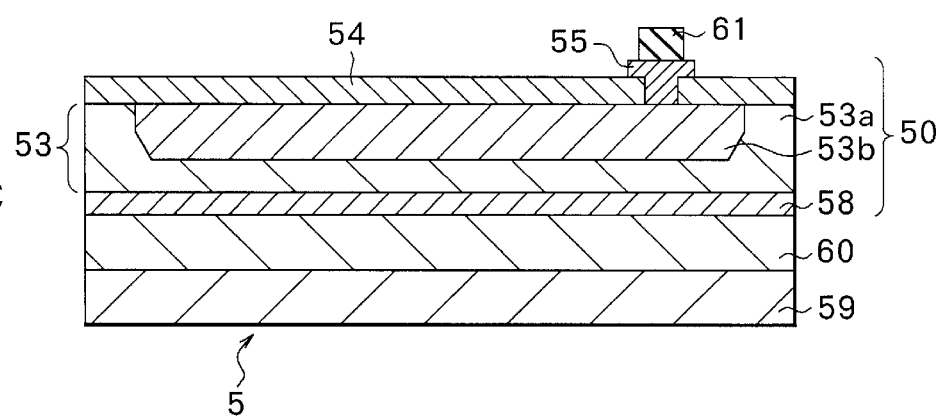

As shown in FIG. 24A, a backside electrode 58 which serves as heat radiation plate made of metal is formed on the entire backside of the semiconductor layer 53 by, for example, deposition. A backside support substrate 59 of a plastic film is adhered to the surface support substrate 57 with an adhesive 60 having adhesion at room temperature, for example, epoxy resin. The surface support substrate 57 is cooled to a temperature of, for example, 5° C. to reduce adhesion of the adhesive 60 and peeled from the semiconductor layer 53. On the surface of the electrode layer 55, a solder bump 61 is formed. Thus, a first device unit 56 in which the backside support substrate 59 supports the photo diode 50 is formed.

Figure 25A:
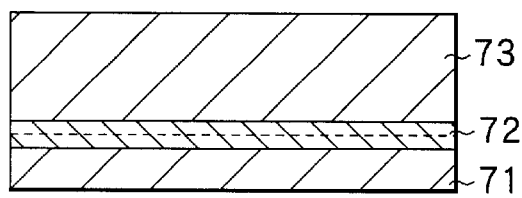
FIGS. 25A through 25E are sectional views for illustrating a method of manufacturing a second device unit according to a method of manufacturing a thin film device of the forth embodiment of the invention.
Figure 25B:
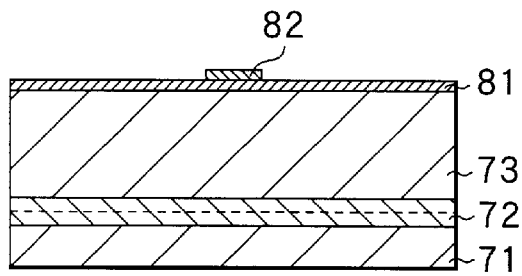
Figure 25C:
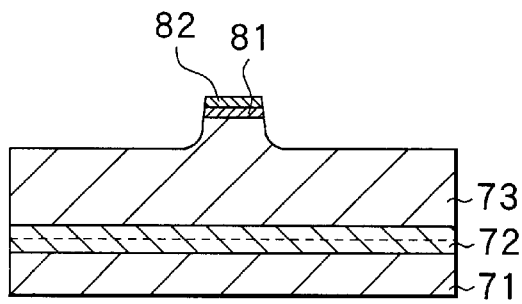

FIGS. 25A through 25E and FIGS. 26A through 26E are sectional views for describing each step of a method of manufacturing a laser diode 80. A semiconductor substrate 71 of n-type indium phosphide (InP) implanting such as sulfur (S) or stannum (Sn) is used. On the surface of the semiconductor substrate 71, a porous layer 72 is formed by anodization like the first embodiment. As shown in FIG. 25A, on the porous layer 72, a semiconductor layer 73 of n-type InP is epitaxial grown. As shown in FIG. 25B, on the semiconductor layer 73, an active layer 81 of p-type InGaAsP (indium-gallium-arsenic-phosphorus) is epitaxial grown. A mask 82 made of SiO$_2$ is formed on a predetermined part of the active layer 81. As shown in FIG. 25C, the active layer 81 and the semiconductor layer 73 are etched by RIE (Reactive Ion Etching) by use of the mask 82.

Figure 25D:
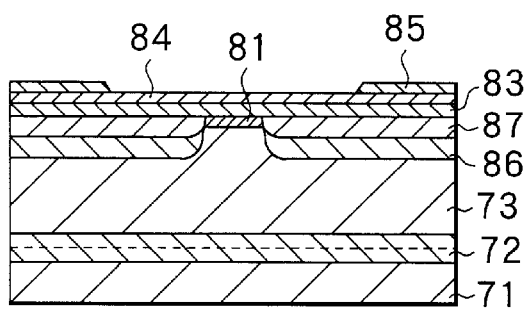

After removing the mask 82, as shown in FIG. 25D, on the semiconductor layer 73, an InP layer (hereinafter referred to a p layer) 86 containing a p-type impurity and an InP layer (hereinafter referred to an n layer) 87 containing an n-type impurity are epitaxial grown in the order named. On the n layer 87, a p layer 83 of InP layer containing a p-type impurity is formed. On the p layer 83, a cap layer 84 made of InGaAsP containing a p-type impurity is disposed and a electrode layer 85 of metal is formed thereon.

Figure 25E:
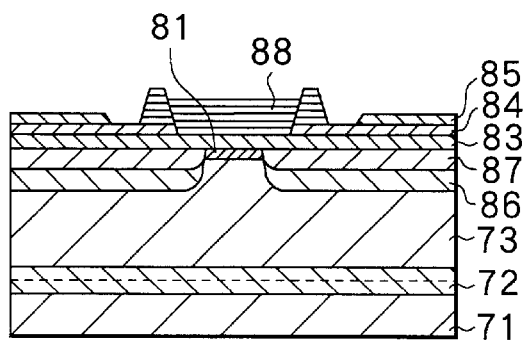
Figure 26A:
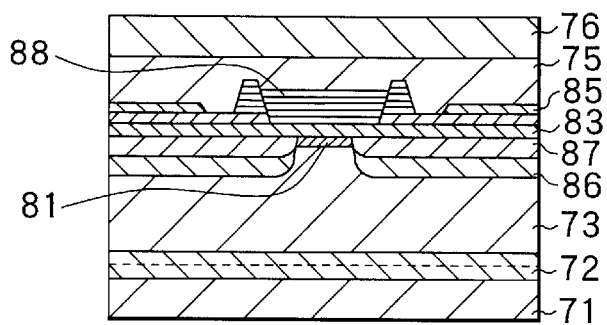
FIGS. 26A through 26E are sectional views for illustrating the step continued from FIGS. 25A through 25E.

As shown in FIG. 25E, a first reflector 88 is formed on the p layer 83. The reflector 88 is formed by stacking six to ten layers of dielectric thin film such as amorphous silicon, $SiN_4$ and MgO (magnesium oxide), for instance. These dielectric thin films are formed by deposition. As shown in FIG. 26A, a surface support substrate 76 of a plastic film is adhered to the surfaces of the first reflector 88 and the electrode layer 85 with an adhesive 75, which is reduced adhesion by cooling at and below room temperature.

Figure 26B:
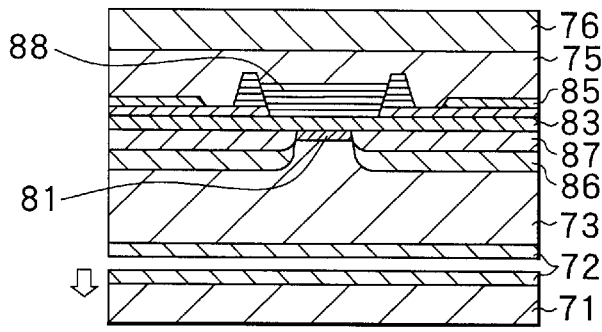
Figure 26C:
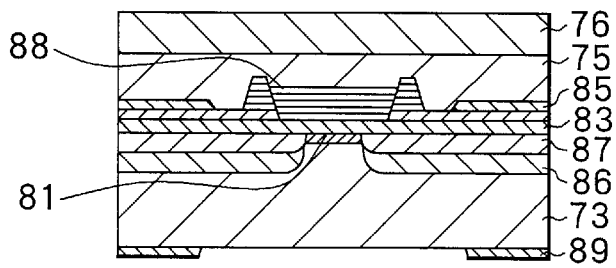
Figure 26D:
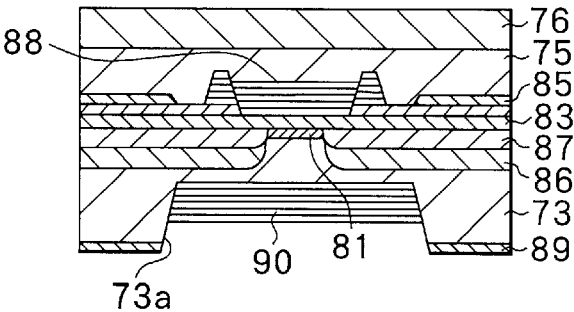

As shown in FIG. 26B, the surface support substrate 76 and the semiconductor substrate 73 are peeled from the semiconductor substrate 71. The method for the peeling is the same as that of the photo diode 50 in FIG. 23D. After the peeling, the residue of the porous layer 72 attaching to the backside of the semiconductor layer 73 is removed by etching with mixed water solution of hydrofluoric acid, nitric acid and acetic acid. As shown in FIG. 26C, an electrode layer 89 of metal is formed on the backside of the semiconductor substrate 73 in a predetermined pattern. As shown in FIG. 26D, the semiconductor substrate 73 is etched from its backside using the electrode layer 89 as a mask and a second reflector 90 is formed in a hole 73a formed by the etching process.

The second reflector 90 is formed by stacking, for example, six to ten layers of the dielectric thin films such as amorphous silicon, SiO or MgO, for instance. Each dielectric thin film is formed by deposition. The second reflector 90 is a mirror emitting light as described hereinlater and its reflectance is smaller than that of the first reflector 88.

Figure 26E:
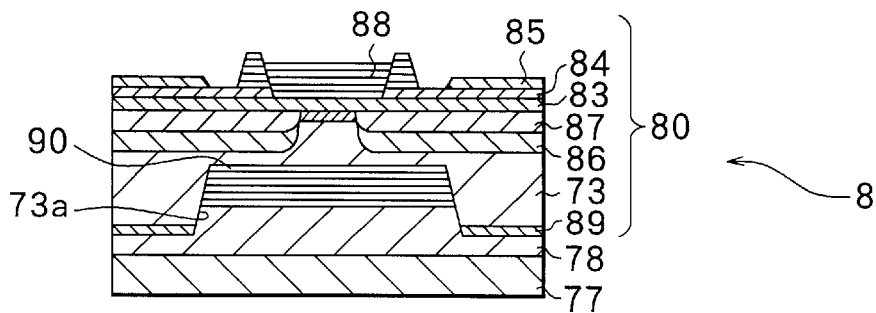

As shown in FIG. 26E, a backside support substrate 77 of a plastic film is adhered to the backside of the semiconductor layer 73 to cover the second reflector 90 and the electrode layer 89. An adhesive 78 for adhering the semiconductor layer 73 to the backside support substrate 77 is reduced its adhesion when cool it at and below room temperature. The surface support substrate 76 is then separated from the semiconductor layer 73 by cooling the surface support substrate 76 to a temperature of, for example, 5° C., whereby reduced adhesion of the adhesive 75. Thus, the laser diode 80 is formed and the second device unit 8 in which the backside support substrate 77 supports the laser diode 80 is formed. The laser diode 80 having such a structure is called surface emitting laser diode, which emits light to vertical direction to a reflector.

The photo diode 50 and the laser diode 80 correspond to a specific example of the "device layer" of the invention and the backside support substrates 59 and 77 correspond to a specific example of the "support substrate" of the invention. Further, the laser diode 80 corresponds to a specific example of the "light emitting device layer" of the invention and the photo diode 50 corresponds to a specific example of the "photodetector device layer" of the invention.

Figures 27A, 27B:
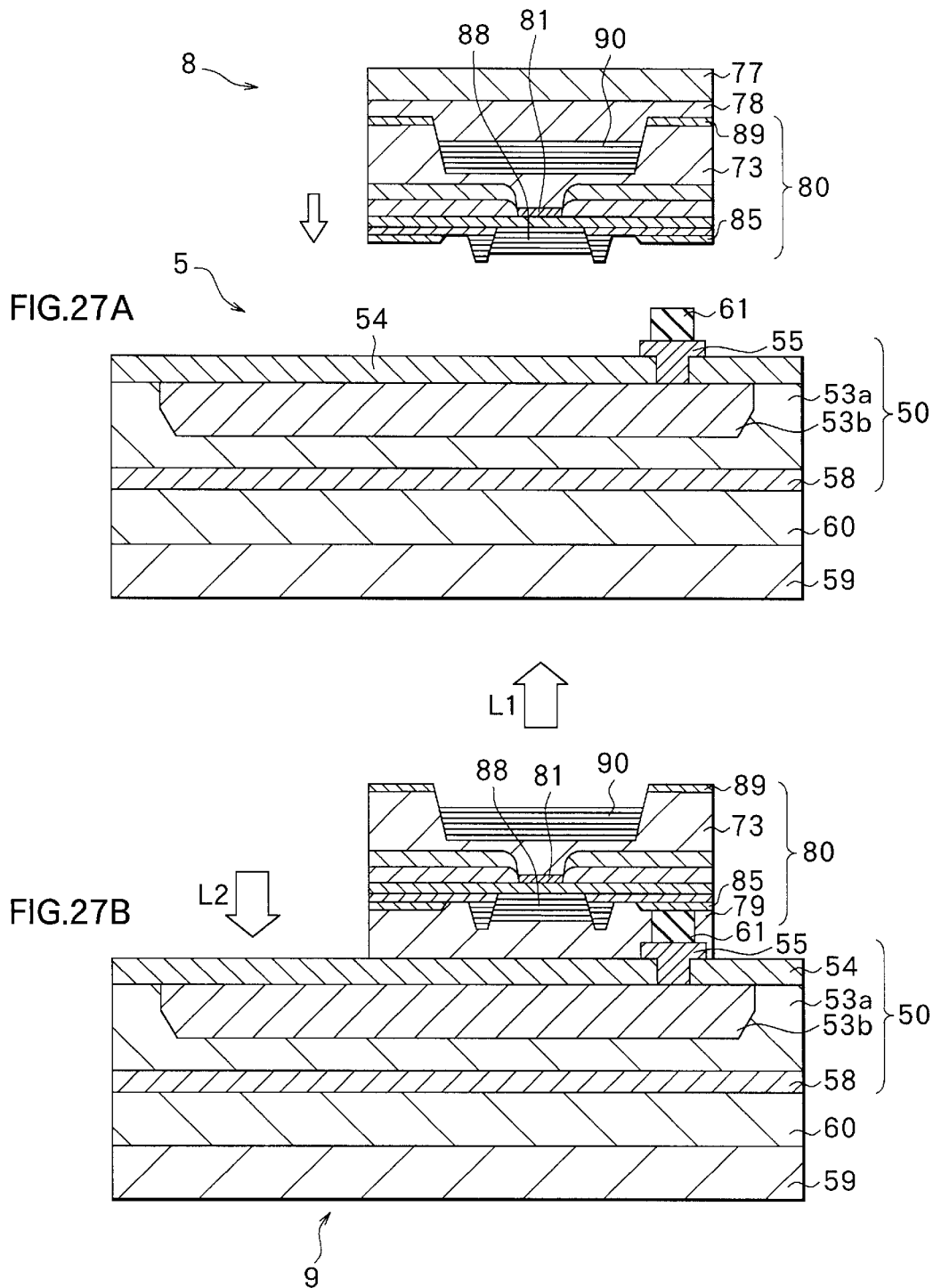
FIGS. 27A and 27B are sectional views for illustrating adhering process of a first device unit and a second device unit according to the fourth embodiment of the invention.

FIGS. 27A and 27B are sectional views for describing a step of adhering the first device unit 5 and the second device unit 8 formed as described above. As shown in FIG. 27A, the first device unit 5 and the second device unit 8 are adhered to face the photo diode 50 and the laser diode 80 each other. At this time, the solder bump 61 on the electrode layer 55 of the photo diode 50 also faces to the electrode layer 85 of the laser diode 80. An adhesive 79 (see FIG. 27B) for adhering the first device unit 5 to the second device unit 8 is made of epoxy resin, for instance.

The surface support substrate 78 is peeled form the laser diode 80 while reducing adhesion of the adhesive 77 between the surface support substrate 78 and the laser diode 80 by cooling under room temperature. With this step, the laser diode 80 and the photo diode 50 are stacked and a thin film device 9 supported by the backside support substrate 59 is obtained. The area of the laser diode 80 is smaller than that of the photo diode 50 to avoid that the laser diode 80 completely intercepts light incident to the photo diode 50 and is positioned to lean to one side of the surface of the photo diode 50.

Referring to FIG. 27B, the effect of the thin film device 9 formed as described above is described. When current is fed through the laser diode 80 through the electrode layers 89 and 85, the light generated in the active layer 81 is reflected repeatedly by the first reflectance 88 and the second reflectance 90 and light resonance called laser oscillation is generated. The light amplifying by laser oscillation is emitted through the second reflectance 90 as indicated by the reference character L1 in FIG. 27B.

In the photo diode 50, reverse voltage is applied to the p layer 53b and the n layer 53a through the electrode layer 55 of minus electrode and the electrode 58 of plus electrode. When light is incident through transparent protective layer 54 as indicated by reference character L2 in FIG. 27B, current flows because of photovoltaic effect in the junction surface of the p layer 53b and the n layer 53a and the current becomes output signal.

In the thin film device of the embodiment, the laser diode 80 and the photo diode 50 are formed integrally. As a result, the photo diode 50 can detect light emitted from the laser diode 80, which reflected by an object and returned. Consequently, the thin film device may be used as a sensor for detecting presence or absence of an object, for instance.

The photo diode 50 and the laser diode 80 are electrically series connected sandwiching the solder bump 61. As a result, when the electrode layer 58 of the photo diode 50 and the electrode layer 89 of the laser diode 80 are connected to external power supply potential and earth potential, respectively, power required both the photo diode 50 and the laser diode 80 can be supplied.

Although the present invention has been described by some embodiments and examples, the invention is not limited to the foregoing embodiments and examples but can be variously modified. For example, in the above-described embodiments, the surface and backside support substrates may be made of EVA (ethylene vinylacetate), which exhibits adhesion at a high temperature. In this case, no adhesive is required by use of adhesion of the surface and backside support substrates.

In the first to third embodiment, description is made for the device layers 20 and 40 as CMOS type transistor. However, the device layers 20 and 40 may be applicable to active devices such as transistors other than CMOS and diode, passive devices such as resistance and capacitor, and photoelectric conversion element such as photo diode and laser diode. It is also applicable to CPU (Central Processing Unit), DRAM (Dynamic Random Access Memory) or the like.

In the first to third embodiment, the semiconductor layer 13 is epitaxial grown on the semiconductor substrate 11 of silicon sandwiching the porous layer 12. However, the semiconductor substrate 11 can be made of Ge (germanium) and the semiconductor layer 13 is hetero-epitaxial grown thereon. In addition, a material having a little mismatch of silicon and lattice constant can be hetero-epitaxial grown on the semiconductor substrate 11 of silicon. For example, on the semiconductor substrate 11 of silicon, SiGe (silicon germanium), Ge, GaAs (germanium-arsenic) or the like can be hetero-epitaxial grown in the order named.

In the above-mentioned embodiments, the surface and the backside support substrates are made of a plastic plate or the like. Instead of the plastic plate, metal including metal fiber, porous metal or the like, ceramic including ceramic fiber, porous ceramic or the like, or other fiber such as paper, hemp, cotton can be used.

In the above-mentioned embodiments, for example, as shown in FIGS. 5A and 5B, the device layer is formed on the semiconductor substrate and the semiconductor substrate is peeled form the porous layer after adhering the surface support substrate to the device layer. However, after the surface support substrate is adhered to the semiconductor substrate and then peeled the semiconductor substrate from the porous layer, the device layer may be formed on the porous layer remained to the surface support substrate side. In this case, a material excellent in heat resistance and having linear expansion coefficient about the same as silicon is used for an adhesive to adhere the surface support substrate to the semiconductor substrate. The device layer is formed under a heat resistant temperature of the adhesive.

As described above, according to the method of manufacturing a thin film device of the invention, the thin film device is formed by combing a plurality of device units. As a result, a method of forming the device layer is not limited unlike the case where a plurality of device layers is stacked in order. This enables to choose a method of forming a device layer in short time. As a result, throughput in the manufacturing process of a thin film device layer is increased. Since the support substrate supports the device layer, it is possible to combine the thin device layers of, for example, 1 $\mu$m thick.

According to the method of manufacturing a thin film device of the invention, the semiconductor layer comprises the device layers on its surface and backside, respectively. This enables easy manufacturing of the thin film device comprising a plurality of device layers.

According to the thin film device of the invention, the photodetector device layer detects light emitted from the light emitting device layer, which is reflected by an object and returned. As a result, one device can detect the passage of an object, which is usually performed by two independent devices.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a thin film device comprising a plurality of devices layers, the method including the steps of:

forming a plurality of device units in which a support substrate supports a device layer;

adhering two device units out of the plurality of devices to face each device layer;

wherein two devices are adhered by use of an adhesive in the step of adherence of the device unit; and wherein a through hole is provided in the support substrate to pass flux dissolving the adhesive.

2. A method of manufacturing a thin film device comprising a plurality of device layers, the method including the steps of:

forming an inside insulating layer made of an insulating material in a semiconductor layer having a pair of facing surfaces;

forming a first device layer on a side of the semiconductor layer;

forming a second device layer on the other side of the semiconductor layer; and wherein the step of forming the inside insulating layer includes the step of ion implantation into the semiconductor layer.

* * * * *